(12) United States Patent
Kitamura et al.

(10) Patent No.: US 7,084,437 B2
(45) Date of Patent: Aug. 1, 2006

(54) SEMICONDUCTOR DEVICE

(75) Inventors: Kohji Kitamura, Shigan (JP); Toshio Sunaga, Ohtsu (JP); Hisatada Miyatake, Ohtsu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/494,479

(22) PCT Filed: Oct. 29, 2002

(86) PCT No.: PCT/JP02/11248

§ 371 (c)(1),
(2), (4) Date: Oct. 18, 2004

(87) PCT Pub. No.: WO03/038900

PCT Pub. Date: May 8, 2003

(65) Prior Publication Data

US 2005/0042825 A1 Feb. 24, 2005

(30) Foreign Application Priority Data

Oct. 31, 2001 (JP) ............................. 2001-334801

(51) Int. Cl.
*H01L 29/88* (2006.01)
*H01L 29/861* (2006.01)

(52) U.S. Cl. .................. 257/104; 257/347; 257/46; 257/212

(58) Field of Classification Search ............... 257/104, 257/43, 44, 46, 47, 68, 121, 212, 213, 192, 257/197, 288, 295, 296, 347
See application file for complete search history.

(56) References Cited

U.S. PATENT DOCUMENTS

| 5,793,697 | A  * | 8/1998 | Scheuerlein | ........... 365/230.07 |
| 6,097,625 | A  * | 8/2000 | Scheuerlein | ................ 365/171 |
| 6,567,299 | B1 * | 5/2003 | Kunikiyo et al. | .......... 365/173 |
| 6,589,180 | B1 * | 7/2003 | Erikson et al. | ............. 600/459 |
| 6,625,057 | B1 * | 9/2003 | Iwata | ........................ 365/158 |
| 6,741,495 | B1 * | 5/2004 | Kunikiyo et al. | .......... 365/158 |

* cited by examiner

*Primary Examiner*—David Nhu
(74) *Attorney, Agent, or Firm*—Joseph P. Abate

(57) ABSTRACT

Provided is an MRAM memory cell structure capable of preventing generation of parasitic transistors. Diodes are adopted as switching elements of an MRAM memory cell. An n-type semiconductor layer and a p-type semiconductor layer, which collectively constitute a diode, are formed on a surface semiconductor layer of an SOI substrate. The n-type semiconductor layer and the p-type semiconductor layer are disposed in a lateral direction and isolated by an isolation region, whereby the diode is isolated electrically from other elements and from the substrate.

15 Claims, 23 Drawing Sheets

SEMICONDUCTOR DEVICE

This application is a 371 PCT/JP02/11248, Oct. 29, 2002.

TECHNICAL FIELD

The present invention relates to nonvolatile memory devices. More specifically, the present invention relates to technologies to be applied effectively to a memory device adopting a spin valve which utilizes magnetoresistive effects such as a tunnel magnetoresistive effect.

BACKGROUND

A random access memory (RAM) utilizing a magnetoresistive effect, in which a resistance value varies depending on a magnetic orientation, is drawing attention recently. Such a RAM utilizing the magnetoresistive effect is referred to as a magnetoresistive RAM (MRAM). Magnetoresistive effects includes an anisotropic magnetoresistive (AMR) effect, a giant magnetoresistive (GMR) effect, and the like are known. In particular, a tunnel magnetoresistive (TMR) effect, which gains a magnetoresistive effect by use of a tunneling current, is highlighted for capability of gaining large magnetic-field sensitivity.

A spin-valve element using the TMR has a laminated structure including an antiferromagnetic layer, a ferromagnetic layer (a pinned layer), an insulating layer (a tunnel layer), and another ferromagnetic layer (a free layer). Such a spin-valve element is also referred to as a magnetic tunnel junction (MTJ) element. The antiferromagnetic layer has a function to fix a magnetic orientation of the adjacent ferromagnetic layer (the pinned layer), whereby a tunneling current flows in the insulating layer when the magnetic orientation of the free layer coincides with the magnetic orientation of the pinned layer. On the contrary, when the magnetic orientation of the free layer is made reverse to the magnetic orientation of the pinned layer, an electric current flowing in the insulating layer becomes less than the tunnel current in the coincided case. In other words, a resistance value of the MTJ element in the direction of lamination varies depending on the magnetic orientation (an orientation of electronic spin) of the free layer. Information regarding "0" or "1" is recordable depending on the magnetic orientation of the free layer, whereby a memory element for retrieving the information in accordance with variation of the resistance value of the MTJ element can be constituted.

As it is clear from the foregoing principle, the memory element (the MRAM) using the TMR effect is nonvolatile; therefore, the memory element constitutes a static element which does not cause destruction of a recorded content upon retrieval of the information. Moreover, retrieval of the information is conducted only by detecting resistance variation of the MTJ element. Therefore, only one switching element, such as a select transistor, is required in a primitive cell for recording one bit. Accordingly, the MRAM is expected to achieve integration as dense as a dynamic random access memory (DRAM) (i.e. low-cost), and to realize a nonvolatile memory such as an electrically erasable read only memory (EEPROM). In addition, it is possible to constitute a memory without causing soft errors or errors attributable to high-energy rays such as cosmic rays as in a static random access memory (SRAM). Moreover, it is possible to realize a solid-state memory element which does not require refreshing as in the DRAM. Furthermore, the MRAM does not have limitation of the number of rewriting as in the EEPROM, and a rewriting speed is also considerably faster than the EEPROM. Due to the numerous and remarkable advantages as described above, the MRAM is expected to be one of the most promising memory devices to replace conventional solid-state memories.

A typical MRAM memory cell structure includes the 1MTJ+1Tr (one MTJ element and one transistor) constitution as described above. Nevertheless, retrieval of the information out of the MRAM cell is based on variation of the resistance value (or voltage variation in the case of constant-current drive). Accordingly, if it is possible to apply a reverse bias between a sense line and a word line of an unselected cell, then a diode can substitute for the switching element. Moreover, writing the information can be achieved by application of an electric current to a word line and a sense line of a selected cell intersecting each other. Therefore, any special function is not required in the switching element. Accordingly, conceivable is a technology of using a diode as the switching element. By use of a diode, the switching element can be formed with a smaller occupied area than forming a transistor (a field effect transistor: FET). Accordingly, it is possible to further enhance the advantage of the MRAM, which is to achieve integration as dense as the DRAM. Moreover, it is not necessary to provide a gate electrode (which function as a readout control line) for controlling on/off states of a select transistor, and a word line (or a bit line) for reading and a word line (or a bit line) for writing can be combined into one line.

For example, U.S. Pat. No. 5,640,363 (Document 1) discloses a memory cell of a stacked structure, in which a thin-film diode of a thin-film transistor (TFT) type is adopted as a switching element and the thin-film diode and an MTJ element is stacked vertically. The memory cell is constituted by sandwiching the stacked structure of the diode and the MTJ element between a word line and a bit line (a sense line) mutually intersecting each other, and a resistance value (or a voltage value in the case of constant-current drive) between the word line and the bit line is measured in order to retrieve information. Upon writing the information, an electric current is applied to a word line and a bit line (a sense line) intersecting in a position of a selected cell, whereby information is written with a composite magnetic field generated therein. A minimum occupied area of the memory cell structure is defined by a necessary current density or a minimum processing dimension required in the MTJ element or in the thin-film diode. Accordingly, the memory cell structure can constitute an MRAM memory cell with the smallest occupied area theoretically.

Nevertheless, the memory cell structure disclosed in Document 1 involves numerous problems. Firstly, the thin-film diode has difficulty in gaining a required on/off ratio. Whereas an on/off ratio of about four digits is preferred, the current thin-film diode cannot gain such an on/off performance easily. Secondly, there is a problem of flatness of a substrate required in the MTJ element. Since magnetic layers and a tunnel insulating film of the MTJ element are formed into extremely thin films, atomic-level flatness is required in the substrate for the MTJ element. Nevertheless, it is difficult for the thin-film diode to achieve such atomic-level flatness, because the thin-film diode is generally made of a polycrystalline silicon film. Accordingly, it is extremely difficult to stack the MTJ element having a predetermined characteristic onto the thin-film diode. Thirdly, on-state resistance of the thin-film diode incurs a problem along with downsizing of the MTJ element. Although there is growing possibility for downsizing the MTJ element in line with characteristic improvements thereof, it is not possible to reduce the on-state resistance of the thin-film diode relevantly to such a downsizing level.

Due to existence of the foregoing disadvantages, it is currently conceived difficult to realize the memory cell structure of stacking the MTJ element on the thin-film diode. In this context, another memory cell structure is proposed, in which a diode is formed on a surface of a semiconductor substrate. For example, U.S. Pat. No. 6,097,625 (Document 2) discloses a memory cell structure, in which a pn-junction diode is constituted by forming an $n^+$ diffusion layer and a $p^+$ diffusion layer on a surface of a semiconductor substrate (a silicon wafer) and an MTJ element is disposed on a region where the junction diode is formed. A word line to be connected to the n+ diffusion layer of the diode is disposed on an insulating film on the substrate, and a sense line is disposed above the word line so as to extend in a direction orthogonal to an extending direction of the word line. The MTJ element is disposed so as to be sandwiched in an intersecting region of the word line and the sense line. One end of the MTJ element contacts with the sense line, and the other end thereof is connected to the $p^+$ diffusion layer via a conductive member such as local wiring. In short, the diode and the MTJ element are serially connected between the sense line and the word line. As similar to the stacked structure disclosed in Document 1, it is possible to retrieve information by measuring a resistance value (or a voltage value) between the word line and the sense line, and to write the information by applying an electric current to the word line and the sense line intersecting each other in a position of a selected cell. In this structure, a sufficient on/off ratio can be obtained because the diode is formed on the surface of the semiconductor substrate. Moreover, it is also possible to reduce on-state resistance because a sufficiently large pn-junction area can be secured. Furthermore, since the MTJ element is formed on an insulating film and on a metallic film where sufficient flatness can be secured, disadvantages as cited in the case of the thin-film diode do not exist therein.

Nevertheless, the memory cell disclosed in Document 2 also involves the following problems. Specifically, since the junction diode is formed on the semiconductor substrate or on a well structure, the diode and the well (or the semiconductor substrate) collectively constitutes a vertical bipolar transistor, which is so-called a parasitic transistor. Depending on aspects of biasing the memory cell, there may be a case where the parasitic transistor starts functioning and a memory cell operation cannot be secured as intended at a designing stage. Moreover, Document 2 also discloses a constitution of a gated diode, in which an FET is formed on the semiconductor substrate, and a diode is formed between a gate of this FET and either a source or a drain thereof. However, the memory cell composed of the gated diode and the MTJ element cannot fulfill a small occupied area. Therefore, the memory cell is disadvantageous to downsizing.

SUMMARY OF THE INVENTION

An object of the present invention is to provide a structure for an MRAM memory cell capable of preventing generation of a parasitic transistor. Another object of the present invention is to provide a structure for an MRAM memory cell excellent in a size advantage so that an occupied area thereof becomes smaller than that of an FET+MTJ cell structure. Still another object of the present invention is to provide a method of fabricating an MRAM memory cell excellent in compatibility with a fabrication process of a logic circuit such as a peripheral circuit.

An outline of the present invention will be described in the following. Specifically, the present invention adopts a junction diode as a switching element of an MRAM cell, and the junction diode is formed either on a silicon-on-insulator (SOI) substrate or on an isolated region (an insulating film) of a silicon wafer. In other words, impurities are doped into a surface semiconductor layer of the SOI substrate, whereby an n-type impurity diffused region and a p-type impurity diffused region are formed. These impurity diffused regions collectively constitute a pn-junction diode. Otherwise, a semiconductor layer such as a polycrystalline silicon film is deposited on an insulating film formed as an element isolation region on a surface of a semiconductor substrate, and impurities are doped into the semiconductor layer to form an n-type impurity semiconductor layer and a p-type impurity semiconductor layer. These impurity semiconductor layers collectively constitute a pn-junction diode. Still otherwise, an impurity is doped into a surface semiconductor layer of an SOI substrate to form either an n-type or p-type impurity diffused region, then a semiconductor layer such as a polycrystalline silicon film is deposited on the impurity diffused region, and another impurity is doped into the semiconductor layer to form either a p-type or n-type impurity semiconductor layer. The impurity diffused region on the surface of the SOI substrate and the impurity semiconductor layer on the semiconductor layer collectively constitute a pn-junction diode.

Each of the foregoing junction diodes is formed either on the SOI substrate or on the insulating film on the semiconductor substrate. Accordingly, the diode is isolated from the substrate and thereby does not generate a parasitic transistor. In this way, it is possible to achieve stable cell operations regardless of application modes of bias voltages when the MRAM is operating. Moreover, since the adopted switching element is not an FET but is a diode, it is possible to reduce a cell area. Such a switching element is advantageous to downsizing process.

Here, plane patterns of the p-type and the n-type impurity diffused regions constituting the junction diode can be either formed into mutually symmetrical shapes or formed in a manner that one of the impurity diffused regions surrounds the other impurity diffused region. In the latter case, it is possible to secure a larger area for junction, whereby on-state resistance of the diode can be reduced. Moreover, the p-type impurity diffused region and/or the n-type impurity diffused region can be formed continuously and integrally in the direction of a word line(s). In this case, standard electric potential of each memory cell can be made constant, and stable memory cell operations are thereby expected.

Moreover, when the diode is made of the semiconductor layer such as a polycrystalline silicon film, the semiconductor layer can be formed simultaneously with formation of a gate electrode of an FET in a logic circuit such as a peripheral circuit. When the diode is formed by diffusion of the impurity on the surface layer of the SOI substrate surface layer, the diode can be formed simultaneously with formation of a source or a drain electrode of a transistor in the logic circuit such as a peripheral circuit. In this way, the diode can be formed in the same steps as the steps of diffusing impurities and of forming the gate electrode in the process of forming the logic circuit. Accordingly, there are very few additional steps upon formation of the junction diode of the present invention. In other words, a fabricating method proposed by the present invention can be regarded as a process excellent in compatibility with the fabricating process of the logic circuit or the like.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE PREFERRED EMBODIMENTS

Figure 1:
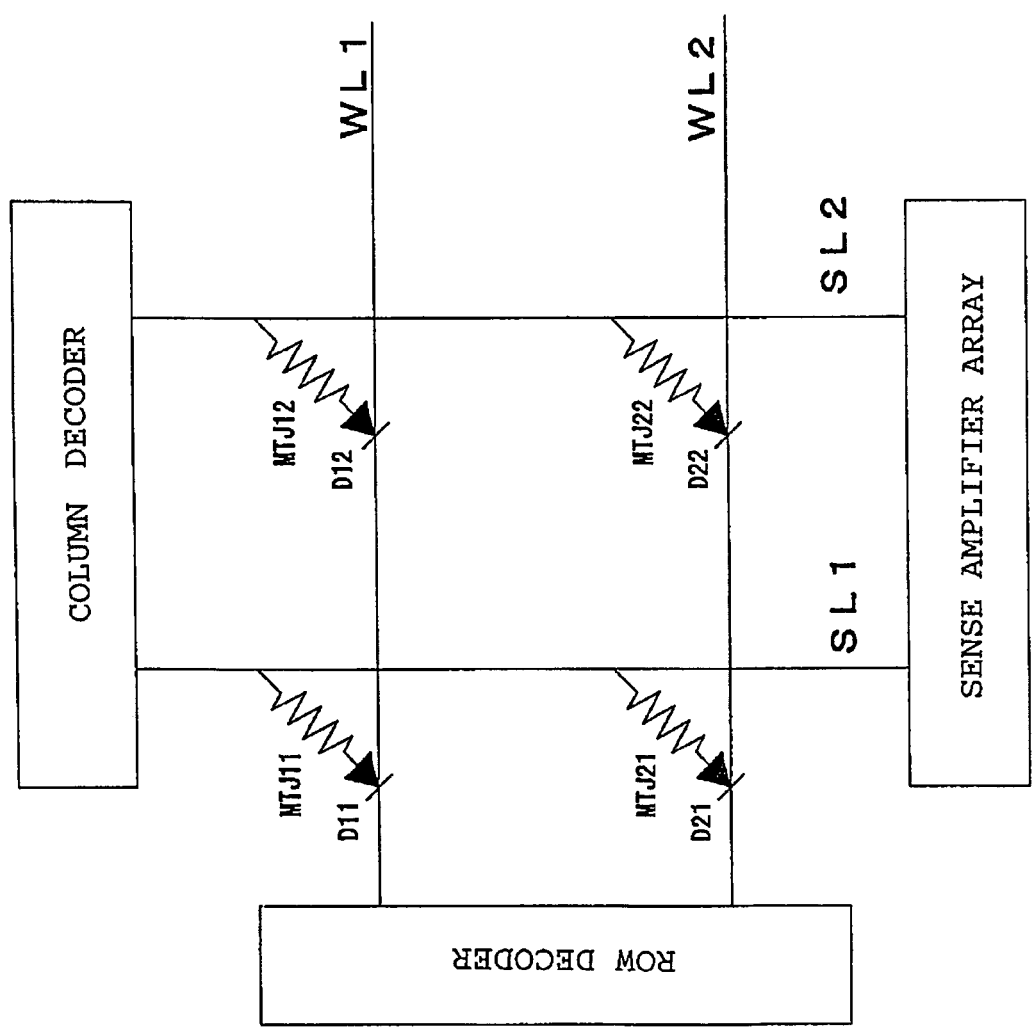
FIG. 1 is a circuit diagram showing one example of a memory device (an MRAM) of a first embodiment of the present invention, the diagram showing a portion of a memory cell region of the MRAM.

Now, embodiments of the present invention will be described in detail with reference to the accompanying drawings. However, it is to be understood that the present invention can be embodied in accordance with various modes and therefore not to be limited only to those disclosed in the following description of the embodiments. It should be also noted that the same constituents or the same members throughout the following embodiments are denoted by the same reference numerals.

(First Embodiment)

FIG. 1 is a circuit diagram showing one example of a memory device (an MRAM) of an embodiment of the present invention, which illustrates partially regarding a memory cell region in particular. As shown in FIG. 1, the MRAM of this embodiment includes word lines WL and sense lines SL. Moreover, magnetic tunnel junction elements MTJ and diodes D are disposed on respective intersecting points of the word line WL and the sense line SL. The magnetic junction element MTJ and the diode D are connected serially to constitute a memory cell. One end (an MTJ end) of the memory cell is connected to the sense line SL and the other end (a D end) thereof is connected to the word line WL. Selection of a memory cell is conducted by selecting one of the sense lines SL and one of the word lines WL, whereby the memory cell located at an intersecting point of the selected sense line SL and the selected word line WL becomes a selected memory cell. Selection of the sense line SL and the word line WL is conducted by a column decoder and a row decoder. Although the word lines WL are arranged in a longitudinal direction and the sense lines SL are arranged in a lateral direction in FIG. 1, it is needless to say that the directions of such arrangement may be reversed to each other.

Information retrieval out of the selected memory cell will be conducted as described below. Specifically, the selected word line WL is maintained at a low-voltage (Low) level and the selected sense line SL is maintained at a high-voltage (High) level in a constant-current limited state. In this state, a forward bias is applied to the diode D of the selected memory cell, and the diode D is set to on-state. If the magnetic tunnel junction element MTJ is in a high-resistance state, electric potential of the selected sense line SL is maintained at High level. If the magnetic tunnel junction element MTJ is in a low-resistance state, an electric current flows into the selected word line WL through the magnetic tunnel junction element MTJ and the diode D at the on-state, whereby electric potential of the selected sense line SL moves to Low level. The information can be retrieved by detecting such voltage levels with a sense amplifier. In this event, an unselected word line WL is maintained at a high-voltage (High) level and an unselected sense line SL is maintained at a low-voltage (Low) level. Accordingly, a reverse bias is applied to the diode D between the unselected sense line SL and the unselected word line WL. Therefore, a potential difference does not occur between the selected word line WL and the unselected sense line SL, or between the unselected word line WL and the selected sense line SL. Normally, in the state of a voltage not higher than a threshold, the diode is not in the forward biased state but set to an off-state (a reverse biased state). In any cases, the electric current does not flow on the unselected cell. Adoption of the above-described potential arrangement can realize a state in which electric potential for causing the electric current to flow is applied only to the magnetic tunnel junction element MTJ of the selected memory cell. Accordingly, the targeted information can be retrieved by retrieving the electric potential on the selected sense line (retrieving as to whether or not the electric current is flowing on the selected memory cell) as described above.

Upon writing the information into the selected memory cell, a controlling electric current of a given magnitude is applied to the selected word line WL and the selected sense line SL. A magnetic orientation of a free layer in the magnetic tunnel junction element MTJ is controlled in accordance with a composite magnetic field generated by this electric current, and writing the information is thereby performed.

Here, in FIG. 1, serial numbers are affixed to the word lines WL and the sense lines SL arranged adjacently in the longitudinal and the lateral directions in the drawing. Meanwhile, serial numbers are also affixed to the magnetic tunnel junction elements MTJ and the diodes D disposed on the respective intersecting points. Specifically, on the intersecting point of the word line WL1 and the sense line SL1, disposed is a memory cell composed of the magnetic tunnel junction element W11 and the diode D11. Although four memory cells are illustrated in the drawing, it is needless to say that more memory cells are to be disposed therein. In the following description, those affixed numbers are omitted. Note that every memory cell has an identical structure in principle.

Figure 2:
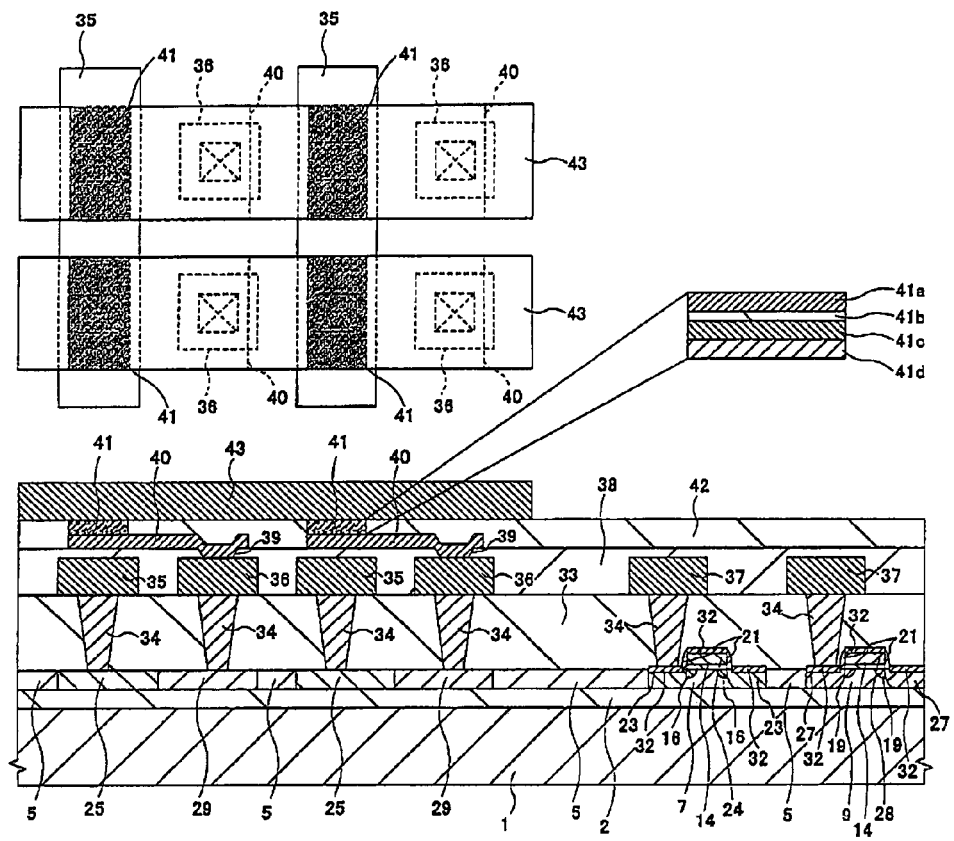
FIG. 2 shows a cross-sectional view and a plan view partially exemplifying a memory cell array and a peripheral circuit on one example of the MRAM according to the first embodiment.

FIG. 2 shows a cross-sectional view and a plan view partially exemplifying a memory cell array and a peripheral circuit on one example of an MRAM according to this embodiment. The partial plan view is disposed on a lower side in FIG. 2, left side of the partial cross-sectional view shows an memory cell array portion and a right side thereof shows a peripheral circuit portion. The partial plan view is disposed on an upper side in FIG. 2. The memory cell array portion of the partial cross-sectional view shown on a lower side refers to a cross section view taken along a center line of one of members 43 (sense lines) in the partial plan view. The above-described rules are also applicable to other drawings in this specification where a cross-sectional view and a plan view are illustrated simultaneously. Moreover, a view shown in an upper right portion in FIG. 2 is an enlarged cross-sectional view of an MTJ portion.

A substrate portion of the MRAM of this embodiment includes a semiconductor substrate portion 1 and a substrate insulating layer 2. The semiconductor substrate portion 1 is typically made of a silicon wafer. The semiconductor substrate portion 1 has a constitution which is characteristic of a typical SOI substrate. However, the semiconductor substrate portion 1 does not always have to include a semiconductor material so far as an SOI structure, that is, a structure having a silicon layer on an insulating substrate is realized. For example, the semiconductor substrate portion 1 may include a glass substrate or a alumina substrate and the like instead. The substrate insulating layer 2 is typically made of a silicon oxide layer. Besides, the insulating layer 2 may be made of an alumina layer or a silicon nitride layer and the like instead. If the semiconductor substrate portion 1 is made of an insulator material, then the substrate insulating layer 2 may be omitted. A surface semiconductor layer is provided on the substrate insulating layer 2. Here, as it will be described later, active regions (7 and 9) of FETs, source/drain regions (16, 19, 23 and 27) thereof, diffused regions (25 and 29) of pn-junction diodes and the like are formed on the surface semiconductor layer. The semiconductor substrate portion 1, the substrate insulating layer 2 and the surface semiconductor layer collectively constitute the SOI substrate.

Element isolation structures 5 are provided on the substrate insulating layer 2. The element isolation structure 5 is typically made of silicon oxide. However, the element isolation structure 5 may be also made of silicon nitride or other insulating materials. Bottom portions of the element isolation structures 5 reach the substrate insulating layer 2, whereby semiconductor regions surrounded by the element isolation structures 5 and the substrate insulating layer 2 are isolated from the substrate and from other elements electrically.

On the surface semiconductor layer in the peripheral circuit region (the right side in the cross-sectional view in FIG. 2), formed are an n-channel-type metal oxide semiconductor field effect transistor (MOSFET) and a p-channel-type MOSFET.

The n-channel-type MOSFET includes an active layer 7, a gate insulating film 14, low-density n-type semiconductor regions 16, sidewalls 21, high-density n-type semiconductor regions 23, a gate electrode 24 and metal silicide layers 32.

The active layer 7 is a p-type impurity semiconductor layer formed by doping an impurity exerting p-type conductivity such as boron (B) onto the surface semiconductor layer of the SOI substrate. A channel for the n-channel-type MOSFET is formed on the active layer 7.

The gate insulating film 14 is a silicon oxide film formed by use of the thermal oxidation method or the thermal chemical vapor deposition (CVD) method. A highly dielectric film with a high dielectric constant such as a silicon nitride film or a tantalum film is also applicable to the gate insulating film 14.

The low-density n-type semiconductor regions 16 are impurity semiconductor regions to be formed on both sides of the gate electrode. An impurity exerting n-type conductivity such as arsenic (As) is doped therein with low impurity density. Each of the low-density n-type semiconductor regions 16 is formed on the side closer to a channel region than the after-mentioned high-density n-type semiconductor region 23 and thereby constitutes part of a lightly doped drain (LDD) structure.

The sidewalls 21 are insulating films to be formed on side faces of the gate electrode 24. The sidewall 24 is typically made of a silicon oxide film. However, a silicon nitride film or other insulating films (dielectric films) may be also applicable thereto.

The high-density n-type semiconductor regions 23 are impurity semiconductor regions to be formed outside the low-density n-type semiconductor regions 16 on the both sides of the gate electrode 24. An impurity exerting n-type conductivity such as phosphorus (P) is doped into each of the high-density n-type semiconductor regions 23 with high impurity density. As previously mentioned, the high-density n-type semiconductor regions constitute the LDD structure together with the low-density n-type semiconductor regions 16.

The gate electrode 24 is formed by patterning a deposited semiconductor layer such as a polycrystalline silicon film formed on the gate insulating film 14. Moreover, the gate electrode 24 is an n-type impurity semiconductor layer doped with an n-type impurity. By forming the gate electrode of the n-channel-type MOSFET as the n-type semiconductor, it is possible to constitute a high-performance MOSFET while facilitating control of a threshold.

The metal silicide layers 32 are metal silicide films formed on surfaces of the high-density n-type semiconductor regions 23 and of the gate electrode 24. Formation of the metal silicide layers 32 can reduce sheet resistance of the high-density n-type semiconductor regions 23 and of the gate electrode 24. Moreover, it is also possible to reduce contact resistance with the after-mentioned connector member 34. Note that the metal silicide layer 32 is not formed in the memory cell region. It is due to the reason that the diodes are formed on the semiconductor substrate in the memory cell region; if the metal silicide layer is formed on the semiconductor region for forming the diodes, then the diodes cannot function because of structure-attributable occurrence of leak currents on junction interfaces. If a so-called salicide process is adopted as a mode of preventing formation of metal silicide layers, then it is possible to exemplify a method of forming a mask with a material which is not transformed into silicide, such as a silicon oxide film or a silicon nitride film. This mode will be described later in detail upon explanation of a fabrication process.

The p-channel-type MOSFET includes an active layer 9, a gate insulating film 14, low-density p-type semiconductor regions 19, sidewalls 21, high-density p-type semiconductor regions 27, a gate electrode 28 and metal silicide layers 32. The active layer 9, the low-density p-type semiconductor regions 19, the high-density p-type semiconductor regions 27 and the a gate electrode 28 severally have similar structures to the above-described active layer 7, the low-density n-type semiconductor regions 16, the high-density n-type semiconductor regions 23 and the gate electrode 23, except for converting the conductive types of the aforementioned constituents into reverse polarities. The structures of the gate insulating film 14, the sidewalls 21 and the metal silicide films 32 of the p-channel-type MOSFET are identical to those in the n-channel-type MOSFET. Note that the gate electrode of the p-channel-type MOSFET of this embodiment is a p-type semiconductor layer. In other words, each of the MOSFETs of the embodiment constitutes a complimentary MOS (C-MOS) structure and adopts a so-called dual gate structure. In this way, it is possible to constitute a high-performance C-MOS circuit.

Junction diodes composed of n-type semiconductor layers 25 and p-type semiconductor layers 29 are formed on the surface semiconductor layer in the memory cell array (the left side in the cross-sectional view in FIG. 2). The n-type semiconductor layers 25 and the p-type semiconductor layers 29 are impurity semiconductor layers severally formed by doping impurities into the surface semiconductor layer of the SOI substrate. An impurity exerting n-type conductivity such as phosphorus (P) is doped into the n-type semiconductor layers 25 with high impurity density. Meanwhile, an impurity exerting p-type conductivity such as boron (B) is doped into the p-type semiconductor layers 29 with high impurity density.

Since the junction diode of the embodiment is formed by doping the impurities into the surface semiconductor layer of the SOI substrate, the junction diode is isolated electrically from other elements or from the substrate. Accordingly, the junction diode does not generate a parasitic transistor. In this way, malfunctions of the MRAM can be prevented. Moreover, as shown in the drawing, the junction diode of the embodiment is a lateral-type diffusion junction diode to be formed on the surface semiconductor layer of the SOI substrate. For this reason, a sufficiently large on/off ratio and sufficiently small on-state resistance can be achieved. Moreover, as it will be described later, the fabrication process thereof will not be particularly complicated. In other words, it is possible to fabricate the junction diode of the embodiment only with a small number of additional masks. As previously described, the silicide layer is not formed on the surfaces of the n-type semiconductor layer 25 and the p-type semiconductor layer 29, which collectively constitutes the junction diode.

An insulating film 33 is formed on the SOI substrate including the above-described junction diodes and the MOSFETs, and the connector members 34 are formed inside the insulating film 33. First layer wiring 35, 36 and 37 is formed on the insulating film 33 so as to contact with the connector members 34. Another insulating film 38 is formed so as to cover the first layer wiring 35, 36 and 37, and local wiring 40 is formed on the insulating film 38 so as to contact with the wiring 36. Magnetic tunnel junction (MTJ) elements 41 are formed on the local wiring 40, and on another insulating film 42 covering the MTJ elements 41 and the local wiring 40, second layer wiring 43 is formed so as to contact with the MTJ elements 41.

As shown in the drawing, the insulating film 33 is an interlayer insulation film for insulating the elements on the SOI substrate from the first layer wiring 35, 36 and 37. The insulating film 33 is typically made of a silicon oxide layer. If the chemical mechanical polishing (CMP) method is applied to the fabrication process thereof, then the insulating layer 33 may be formed as a multilayer film provided with a silicon nitride film on the outermost surface thereof, which functions as a blocking layer. Meanwhile, a low-dielectric film with a low dielectric constant may be used as the insulating film 33 in order to reduce stray capacitance of the wiring. Such a low-dielectric film is typically made of a silicon oxide film containing fluorine or a spin-on-glass (SOG) film, for example.

The connector members 34 are conductive members for connecting the elements on the SOI substrate and the first layer wiring 35, 36 and 37. The connector member 34 is typically made of silicon oxide with high impurity density or made of metal with a high melting point such as tungsten. In the case of using the metal with a high melting point, it is preferred to apply an appropriate blocking layer (such as titanium nitride).

The first layer wiring 35, 36 and 37 is typically made of metal with a high melting point such as tungsten, or made of a laminated metallic film composed of tungsten and a blocking layer such as titanium nitride. In the case of providing the blocking layer with a diffusion-suppressive effect of metal, low-resistivity metal such as aluminum or copper may be also applicable. Out of the first layer wiring, the wiring 35 is formed so as to extend in the up-and-down direction (in a first direction) as shown in the plan view in FIG. 2. The wiring 35 functions as the word lines WL. The wiring 35 is connected to the n-type semiconductor layers 25 of the junction diodes via the connector members 34. The wiring 36 is connected to the p-type semiconductor layers 29 of the junction diodes via the connector members 34, whereby the wiring 36 functions as connector members to the local wiring 40. The wiring 37 constitutes first layer wiring of the peripheral circuit region.

The insulating film 38 is similar to the insulating film 33. Nevertheless, the insulating film 38 is formed thicker than the first layer wiring 35, 36 and 37 to some extent so that the insulating film 38 can bury the first layer wiring 35, 36 and 37. If the first layer wiring 35, 36 and 37 is formed in accordance with the Damascene process, the insulating film 38 may be separated into two layers of a layer for burying spaces in the first layer wiring 35, 36 and 37 and a layer to be formed on the first layer wiring 35, 36 and 37. The thickness of the insulating film 38 to be formed on the first layer wiring 35, 36 and 37 is set to a range from 50 to 100 nm, for example. The insulating film 38 is formed as the sufficiently thin film as described above, so that magnetic fields generated by the wiring 35 (the word lines WL) can reach free layers of the MTJ elements 41. Moreover, since the insulating film 38 on the wiring 36 is formed as the sufficiently thin film, it is possible to curtail formation of conductive members such as studs on contact holes for connecting to the local wiring 40.

The local wiring 40 is wiring for connecting the wiring 36 to one end of each MTJ element 41. The local wiring 40 is typically made of metal such as tungsten. The thickness thereof is made sufficiently thin so that the magnetic fields generated by the wiring 35 (the word lines WL) can reach the free layers of the MTJ elements 41. For example, the thickness thereof is typically set to 100 nm.

The MTJ element 41 includes the free layer 41a made of a ferromagnetic material, an insulating layer 41b, a pinned layer 41c made of a ferromagnetic material and an antimagnetic layer 41d. In addition, an intermediate layer may be also provided between the foregoing layers or either on a top or bottom layer of the above-described lamination as appropriate. Cobalt (Co) films can be used for the free layer 41a and the pinned layer 41c, and a FeMn layer can be used for the antimagnetic layer 41d, for example. Moreover, a silicon oxide layer or an alumina ($Al_2O_3$) layer can be used for the insulating layer 41b. These thin films can be formed by use of the sputtering method or the CVD method. Note that the order of lamination of the MTJ element 41 as illustrated in the drawing may be inverted. Moreover, a metallic layer can be formed as an electrode between each layer of the free layer 41a and the antimagnetic layer 41d and relevant metallic wiring to be connected thereto. The metallic layer is typically made of titanium. It is also possible to form the metallic layer inside the upper or lower wiring layer.

The insulating film 42 is similar to the insulating film 33. The second layer wiring 43 is typically made of metal such as copper or aluminum. The second layer wiring 43 may also have a laminated structure together with a blocking layer such as titanium nitride. The second layer wiring 43 is formed so as to extend in the right-and-left direction (in a second direction) as shown in the plan view in FIG. 2. The second layer wiring 43 functions as the sense lines SL. The second layer wiring 43 is connected to the other end of each MTJ element 41.

According to the above-described MRAM of the embodiment, the junction diodes are formed on the SOI substrate in an isolated manner from the other elements, for example. In this way, parasitic transistors are not generated thereon, and normal operations of the MRAM is thereby secured. Moreover, since the sufficient on/off ratio and on-state resistance are secured in the diode of the embodiment, it is possible to constitute a high-performance MRAM memory cell. Furthermore, since the MTJ element 41 of the embodiment is formed on the metallic local wiring 40, atomic-level flatness is secured. As a result, the MTJ element 41 can fully exert performances thereof, which is to be realized by a fine thin-film structure.

Now, description will be made regarding one example of a method of fabricating the MRAM of the embodiment with reference to the drawings. FIG. 3 to FIG. 23 are cross-sectional views and plan views showing the example of the method of fabricating the MRAM of the embodiment arranged in accordance with the order of the steps.

Figure 3:
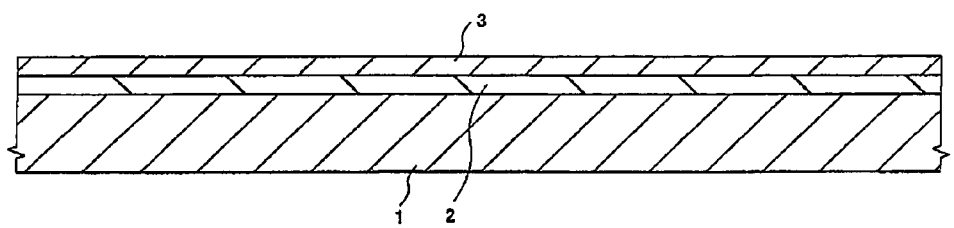
FIG. 3 is a cross-sectional view showing one example of a method of fabricating the MRAM according to the first embodiment arranged in accordance with the order of the steps.
Figure 4:
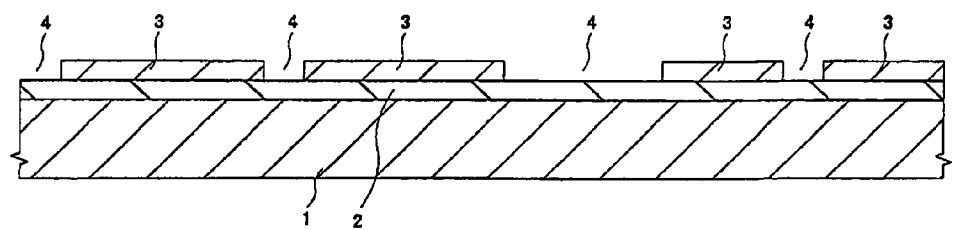
FIG. 4 is another cross-sectional view showing the example of the method of fabricating the MRAM according to the first embodiment arranged in accordance with the order of the steps.

First, the SOI substrate composed of the semiconductor substrate portion 1, the substrate insulating layer 2 and the surface semiconductor layer 3 is prepared (FIG. 3). Trenches 4 are formed on the surface semiconductor layer 3 by use of publicly-known photolithography or etching techniques (FIG. 4). Bottoms of the trenches 4 are formed so as to reach the substrate insulating layer 2.

Figure 5:
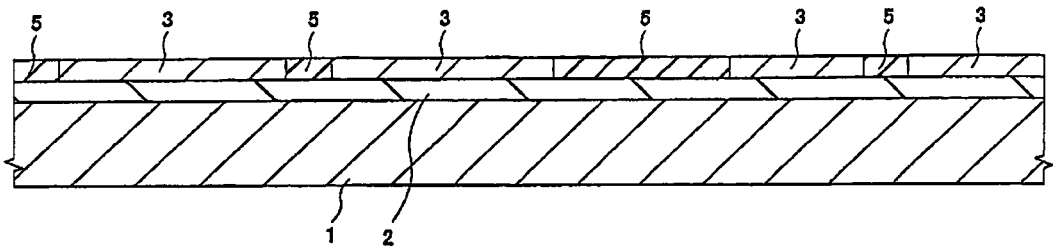
FIG. 5 is another cross-sectional view showing the example of the method of fabricating the MRAM according to the first embodiment arranged in accordance with the order of the steps.

An unillustrated silicon oxide film, for example, is formed on the entire surface of the SOI substrate to bury the trenches 4. Thereafter, the silicon oxide film on the surface semiconductor layer 3 is removed by the CMP method. In this way, isolation regions 5 are formed in the trenches 4 (FIG. 5).

Figure 6:
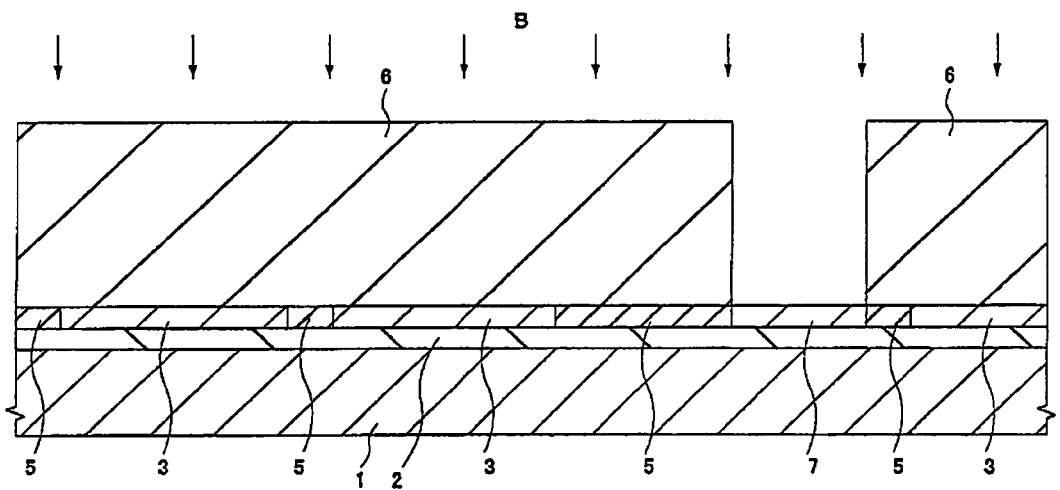
FIG. 6 is another cross-sectional view showing the example of the method of fabricating the MRAM according to the first embodiment arranged in accordance with the order of the steps.

Next, formed is a photoresist film 6 provided with an aperture in a region where the n-channel-type MOSFET in the peripheral circuit region is to be formed. Thereafter, boron (B) is ion-implanted as the impurity, and the active layer 7 of the n-channel-type MOSFET is thereby formed (FIG. 6). Note that it is necessary to carry out activation of the impurity after ion implantation by means of a thermal treatment. In the following explanation, description of the activation treatment will be omitted. Otherwise, the activation steps with thermal treatments may be conducted all at once after several steps of ion implantation. Particularly, if a discrete thermal process (such as a thermal oxidation process for forming a gate insulating film) takes place in the course of the fabrication process, then independent thermal process for activation of the impurity may be also omitted.

Figure 7:
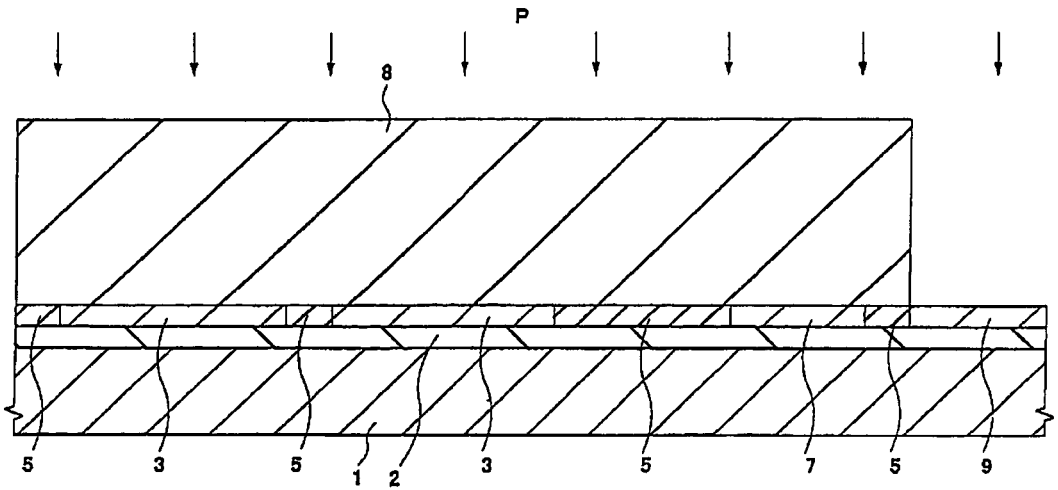
FIG. 7 is another cross-sectional view showing the example of the method of fabricating the MRAM according to the first embodiment arranged in accordance with the order of the steps.

Next, formed is a photoresist film 8 provided with an aperture in a region where the p-channel-type MOSFET in the peripheral circuit region is to be formed. Thereafter, phosphorus (P) is ion-implanted as the impurity, and the active layer 9 of the p-channel-type MOSFET is thereby formed (FIG. 7).

Figure 8:
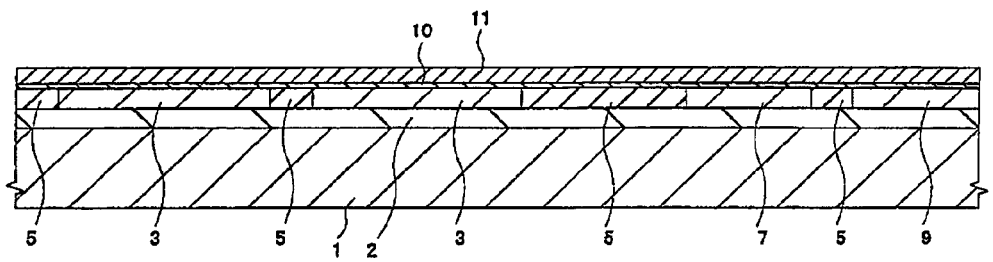
FIG. 8 is another cross-sectional view showing the example of the method of fabricating the MRAM according to the first embodiment arranged in accordance with the order of the steps.

After removing the photoresist film 8, a silicon oxide film 10 and a polycrystalline silicon film 11 are formed on the surface of the SOI substrate (FIG. 8). The silicon oxide film 10 can be formed by the thermal CVD method, for example. Although the silicon oxide film is shown as an example therein, a silicon nitride film, an alumina film, a tantalum oxide film and other dielectric films are also applicable instead of the silicon oxide film 10. Otherwise, it is also possible to form the silicon oxide film by means of selectively oxidizing only a silicon region on the surface of the SOI substrate. In addition, although the polycrystalline silicon film 11 is shown as an example therein, an amorphous silicon layer is also applicable instead.

Figure 9:
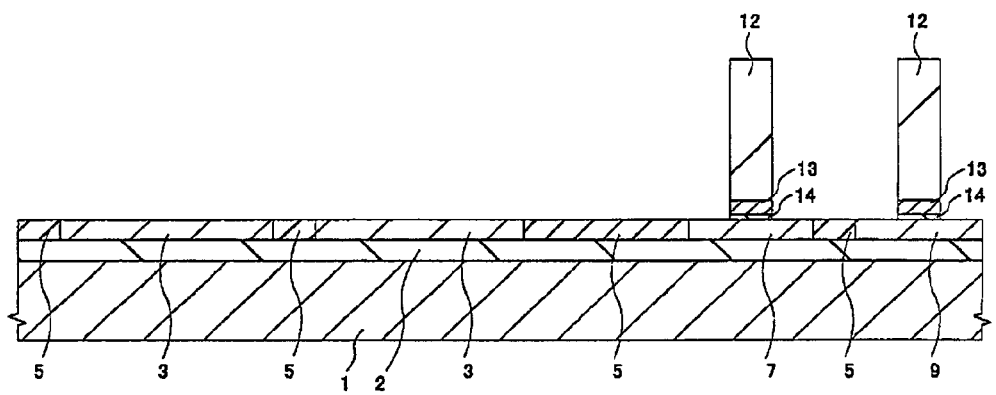
FIG. 9 is another cross-sectional view showing the example of the method of fabricating the MRAM according to the first embodiment arranged in accordance with the order of the steps.

Next, formed is a photoresist film 12 patterned in accordance with patterns of gate electrodes of the MOSFETs, and the polycrystalline silicon film 11 and the silicon oxide film 10 are etched by use of the photoresist film 12 as a mask to form the gate electrodes 13 and the gate insulating films 14 (FIG. 9).

Figure 10:
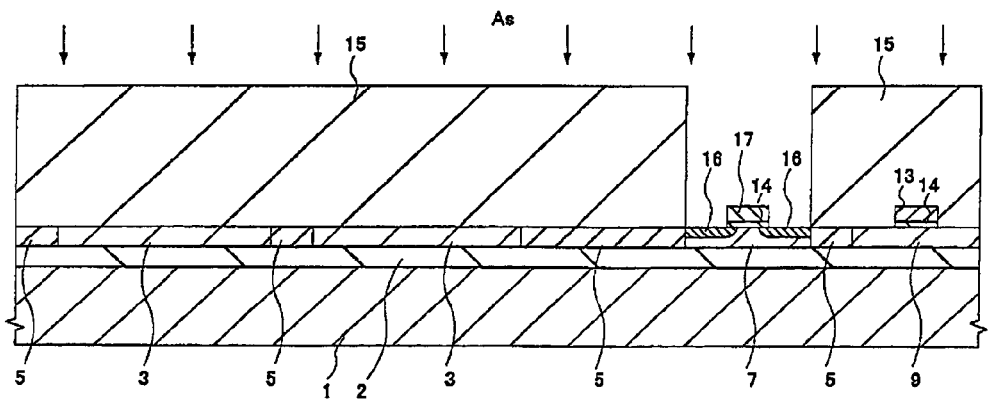
FIG. 10 is another cross-sectional view showing the example of the method of fabricating the MRAM according to the first embodiment arranged in accordance with the order of the steps.

Next, formed is a photoresist film 15 provided with an aperture in the region where the n-channel-type MOSFET in the peripheral circuit region is to be formed. Thereafter, arsenic (As) is ion-implanted as the impurity (FIG. 10). The impurity is implanted in the gate electrode 13 in a self-aligned manner, whereby the low-density n-type semiconductor regions 16 of the n-channel-type MOSFET are formed in a self-aligned manner on the both sides of the active layer 7 of the gate electrode 13. Simultaneously, arsenic is also implanted in the gate electrode 13 in the relevant region to form a gate electrode 17 made of n-type polycrystalline silicon. Note that arsenic is shown as an example herein in consideration of uneasiness of thermal diffusion of the impurity. However, phosphorus is also adoptable as the impurity therein.

Figure 11:
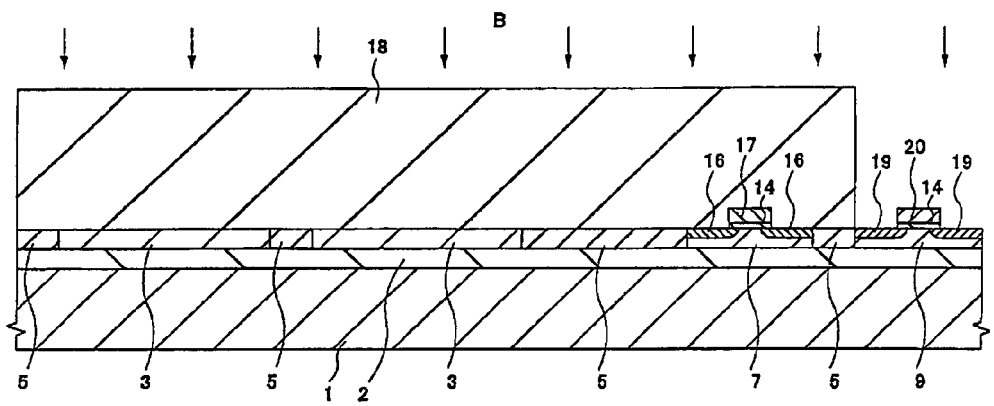
FIG. 11 is another cross-sectional view showing the example of the method of fabricating the MRAM according to the first embodiment arranged in accordance with the order of the steps.

Next, formed is a photoresist film 18 provided with an aperture in the region where the p-channel-type MOSFET in the peripheral circuit region is to be formed. Thereafter, boron (B) is ion-implanted as the impurity (FIG. 11). The impurity is implanted in the gate electrode 13 in a self-aligned manner as similar to the foregoing case, whereby the low-density p-type semiconductor regions 19 of the p-channel-type MOSFET are formed in a self-aligned manner. Moreover, the gate electrode 13 in the relevant region is formed into a p-type gate electrode 20.

Figure 12:
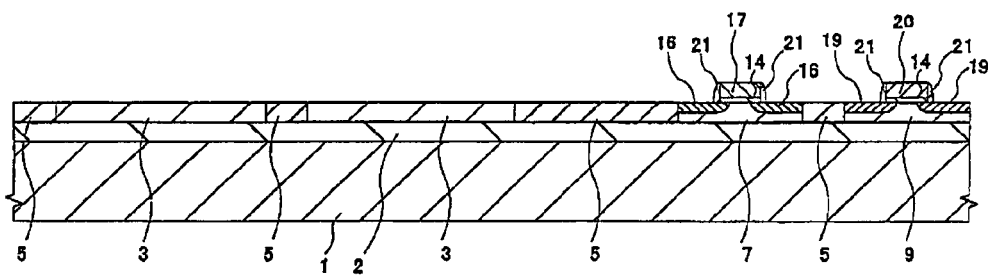
FIG. 12 is another cross-sectional view showing the example of the method of fabricating the MRAM according to the first embodiment arranged in accordance with the order of the steps.

The photoresist film 18 is removed, and then an unillustrated insulating film such as a silicon oxide film or a silicon nitride film is deposited on the surface of the substrate. Thereafter, the insulating film is subjected to anisotropic etching, whereby the sidewalls 21 are formed on the side faces of the gate electrodes 17 and 20 (FIG. 12).

Figure 13:
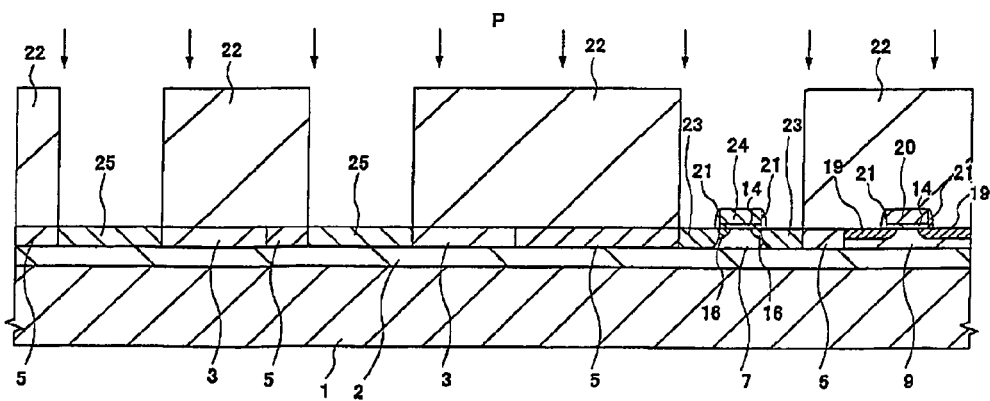
FIG. 13 is another cross-sectional view showing the example of the method of fabricating the MRAM according to the first embodiment arranged in accordance with the order of the steps.

Next, formed is a photoresist film 22 provided with apertures in regions where the n-channel-type MOSFET in the peripheral circuit region and the n-type semiconductor layers 25 of the diodes in the memory cell region are to be formed. Thereafter, phosphorus (P) is ion-implanted as the impurity (FIG. 13). The impurity is implanted in the gate electrode 17 and in the sidewalls 21 in a self-aligned manner, whereby the high-density n-type semiconductor regions 23 are formed in a self-aligned manner on the outside of the low-density n-type semiconductor regions 16 on the both sides of the gate electrode 17. Simultaneously, phosphorus is also implanted in the gate electrode 17 in the relevant region to form an n-type gate electrode 24. Also simultaneously, phosphorus is implanted in the surface semiconductor layer 3 in the relevant memory cell region to form the n-type semiconductor layers 25.

Figure 14:
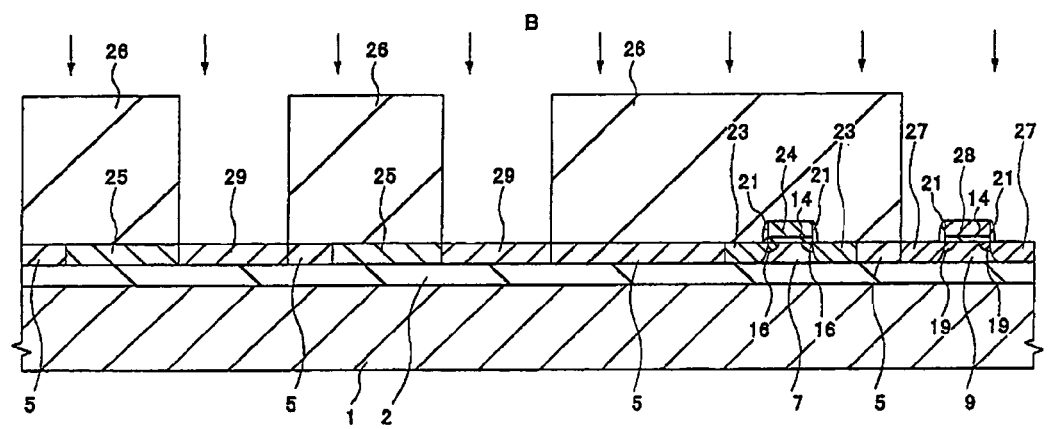
FIG. 14 is another cross-sectional view showing the example of the method of fabricating the MRAM according to the first embodiment arranged in accordance with the order of the steps.
Figure 15:
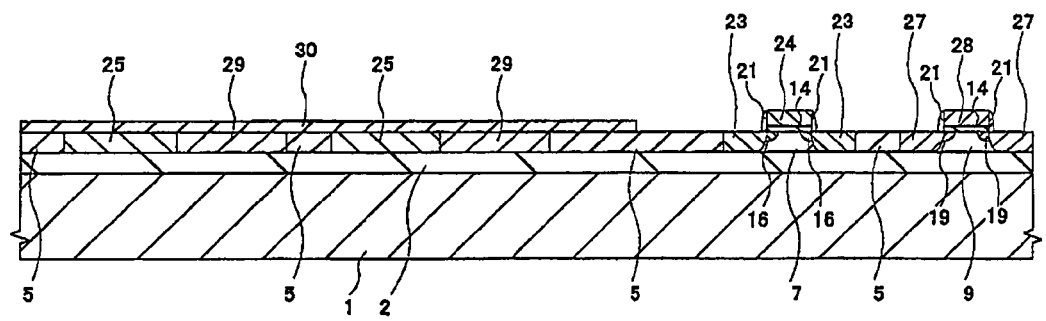
FIG. 15 is another cross-sectional view showing the example of the method of fabricating the MRAM according to the first embodiment arranged in accordance with the order of the steps.

Next, formed is a photoresist film 26 provided with apertures in regions where the p-channel-type MOSFET in the peripheral circuit region and the p-type semiconductor layers 29 of the diodes in the memory cell region are to be formed. Thereafter, boron (B) is ion-implanted as the impurity (FIG. 14). The impurity is implanted in the gate electrode 20 and in the sidewalls 21 in a self-aligned manner, whereby the high-density p-type semiconductor regions 27 are formed in a self-aligned manner on the outside of the low-density p-type semiconductor regions 19 on the both sides of the gate electrode 20. Simultaneously, boron is also implanted in the gate electrode 20 in the relevant region to form a p-type gate electrode 28. Also simultaneously, boron is implanted in the surface semiconductor layer 3 in the relevant memory cell region to form the p-type semiconductor layers 29.

As described above, the n-type semiconductor layer 25 and the p-type semiconductor layer 29 collectively constitute the diode. In this embodiment, the diodes can be formed simultaneously in the process of forming the high-density impurity semiconductor regions of the MOSFETs. Therefore, there are no additional steps for formation of the diodes of the embodiment, because the diodes can be fabricated within the conventional process except for a little modification of mask designs.

Figure 16:
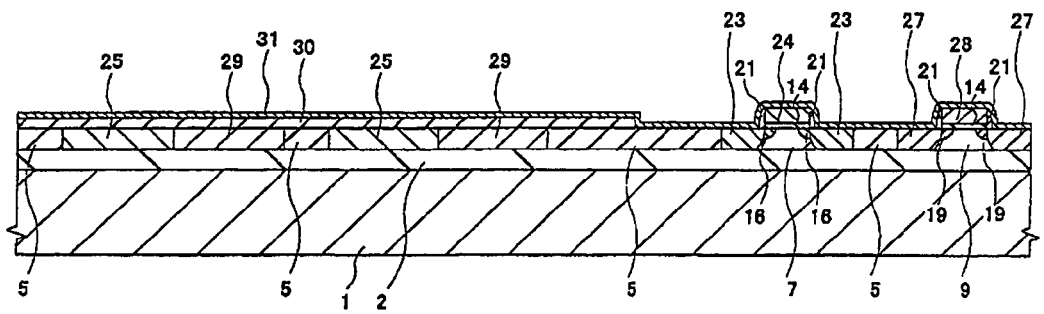
FIG. 16 is another cross-sectional view showing the example of the method of fabricating the MRAM according to the first embodiment arranged in accordance with the order of the steps.

Next, formed are a mask layer 30 for covering the memory cell region (FIG. 15), and a metallic layer 31 for covering the surface of the entire substrate (FIG. 16). The mask layer 30 is typically made of a silicon oxide film or a silicon nitride film, for example. The metallic layer 31 is typically made of metal such as tungsten or cobalt, which forms a metal silicide layer with low resistivity by a reaction with silicon.

Figure 17:
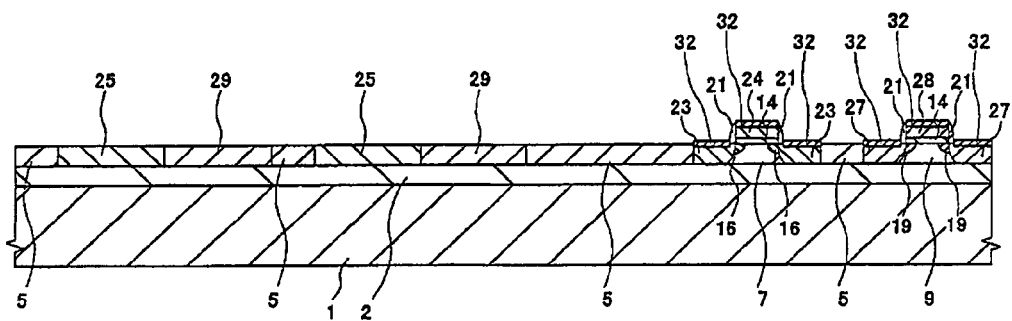
FIG. 17 is another cross-sectional view showing the example of the method of fabricating the MRAM according to the first embodiment arranged in accordance with the order of the steps.

The metallic layer 31 and the silicon are subjected to a reaction under a thermal treatment, whereby metal silicide layers 32 are formed in regions on the semiconductor substrate where the silicon is exposed. Unreacted portions of the metallic layer 31 are removed by etching. In other words, a salicide process is conducted. Subsequently, the mask layer 30 is removed (FIG. 17). However, it is to be noted that the mask layer 30 does not always have to be removed. Since the mask layer 30 is formed and then the metal silicide films 32 are formed as described above, no metal silicide layers are formed in the portions covered with the mask layer 30. That is, no silicide layers are formed on the diodes (on the n-type semiconductor layers 25 and the p-type semiconductor layers 29) in the memory cell region. In this way, leakage of an electric current attributable to the silicide layer on a junction interface of the diode is prevented. In other words, a difference between the method of fabricating the diodes of this embodiment from the conventional process is limited to just one additional mask used for formation of the mask layer 30, and alignment of the additional mask does not require high precision. Therefore, an increase in burden of the process attributable to addition of the diodes of the embodiment is not significant. Moreover, when the mask layer 30 is made of a silicon oxide film, it is needless to remove the mask layer 30.

Figure 18:
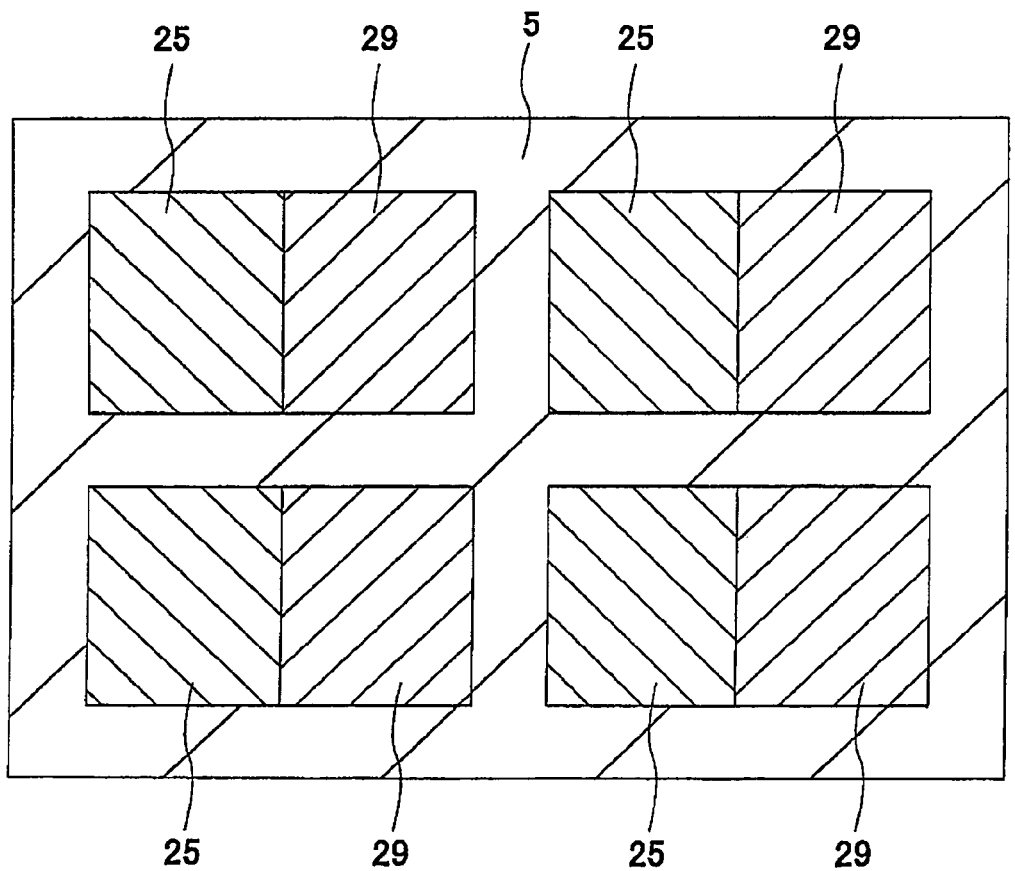
FIG. 18 is a plan view showing the example of the method of fabricating the MRAM according to the first embodiment arranged in accordance with the order of the steps.

FIG. 18 shows a plan view of the memory cell region at this stage. The pairs of the n-type semiconductor regions 25 and the p-type semiconductor regions 29 are separated from the respective elements by the isolation region 5 and severally formed on islands. Therefore, no parasitic translators are generated. Moreover, each of the n-type semiconductor layer 25 and the relevant p-type semiconductor layer 29 are formed symmetrically, and a boundary of the two layers constitutes a composition surface. Due to the cell size thereof, sufficiently low on-state resistance can be secured.

Figure 19:
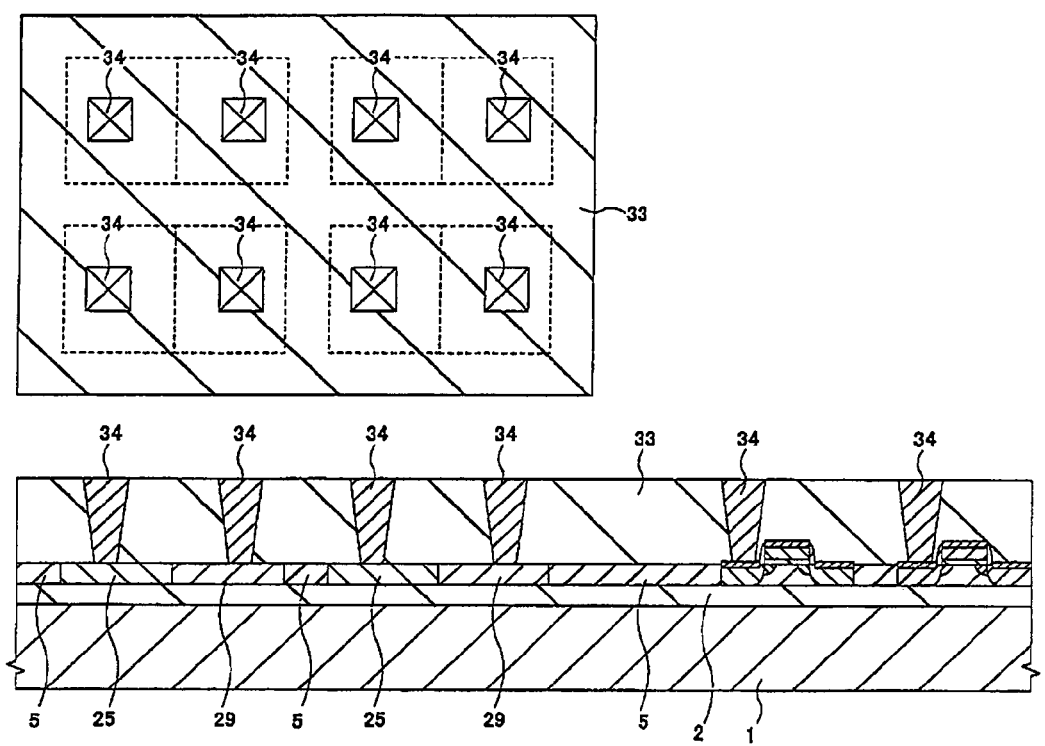
FIG. 19 shows a plan view and a cross-sectional view regarding the example of the method of fabricating the MRAM according to the first embodiment arranged in accordance with the order of the steps.

Next, the insulating film 33 is formed on the entire substrate 33, and then contact holes are formed on given regions on the insulating film 33. A conductive film is buried into each contact hole to form the conductive member 34 (FIG. 19). The publicly-known CVD method is applicable upon formation of the insulating film 33. Moreover, the publicly-known photolithography and etching techniques are applicable upon formation of the contact holes. Furthermore, the conductive members 34 can be formed by deposition of a conductive film (such as a polycrystalline silicon film with high impurity density) for burying the contact holes and subsequent application of the CMP method.

Figure 20:
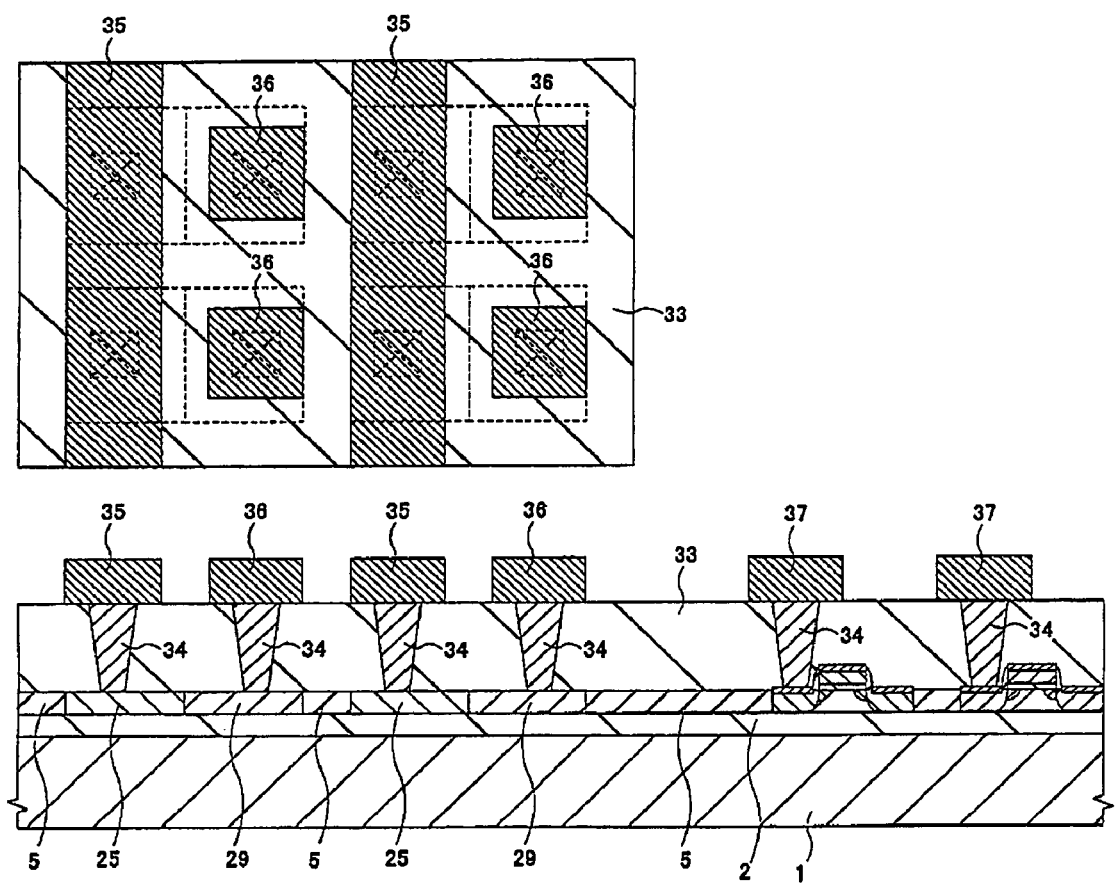
FIG. 20 shows another plan view and another cross-sectional view regarding the example of the method of fabricating the MRAM according to the first embodiment arranged in accordance with the order of the steps.
Figure 21:
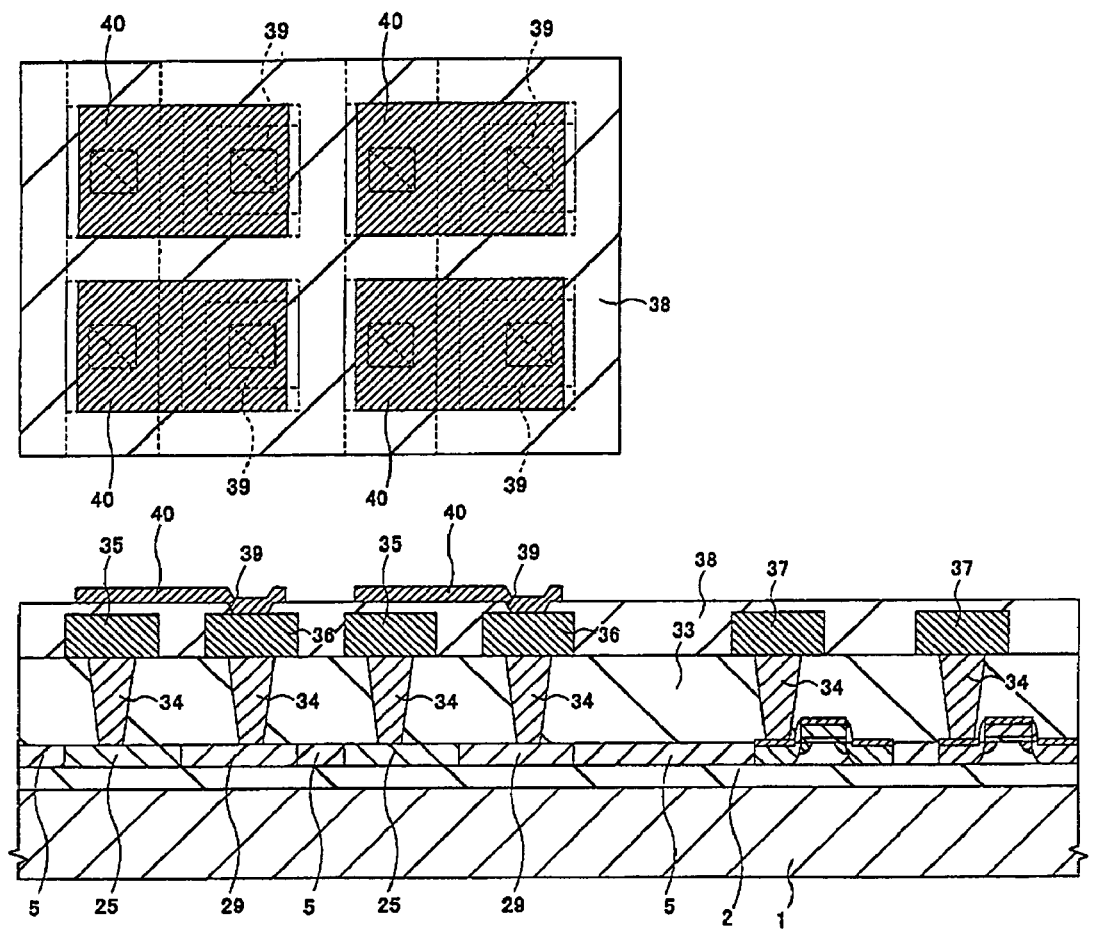
FIG. 21 shows another plan view and another cross-sectional view regarding the example of the method of fabricating the MRAM according to the first embodiment arranged in accordance with the order of the steps.

A metallic film such as tungsten is deposited on the insulating film 33, and then the metallic film is formed into the first layer wiring 35, 36 and 37 by use of the publicly-known photolithography and etching techniques (FIG. 20). The sputtering method is applicable to the deposition of the metallic film. Here, as previously described, upon patterning of the first layer wiring 35, 36 and 37, the wiring 35 is patterned so as to extend in the up-and-down direction of the drawing (the first direction). Next, formed is the insulating film 38 for covering the first layer wiring 35, 36 and 37. Alternatively, it is also possible to form the first layer wiring as described in the preceding drawing by use of the Damascene process. Specifically, a metallic film is buried into the trenches formed on the insulating film 38, and unnecessary portions of this metallic film is removed by the CMP method to form the wiring inside the trenches. In this case, a thin film for covering the first wiring is formed over the insulating film 38. Contact holes 39 are formed on the insulating film 38 on the wiring 36, and then an unillustrated metallic film is deposited thereon. The metallic film is patterned to form the local wiring 40 (FIG. 21). Since the insulating film 38 on the wiring 36 is sufficiently thin, it is not necessary to bury a conductor member into the contact hole 39.

Figure 22:
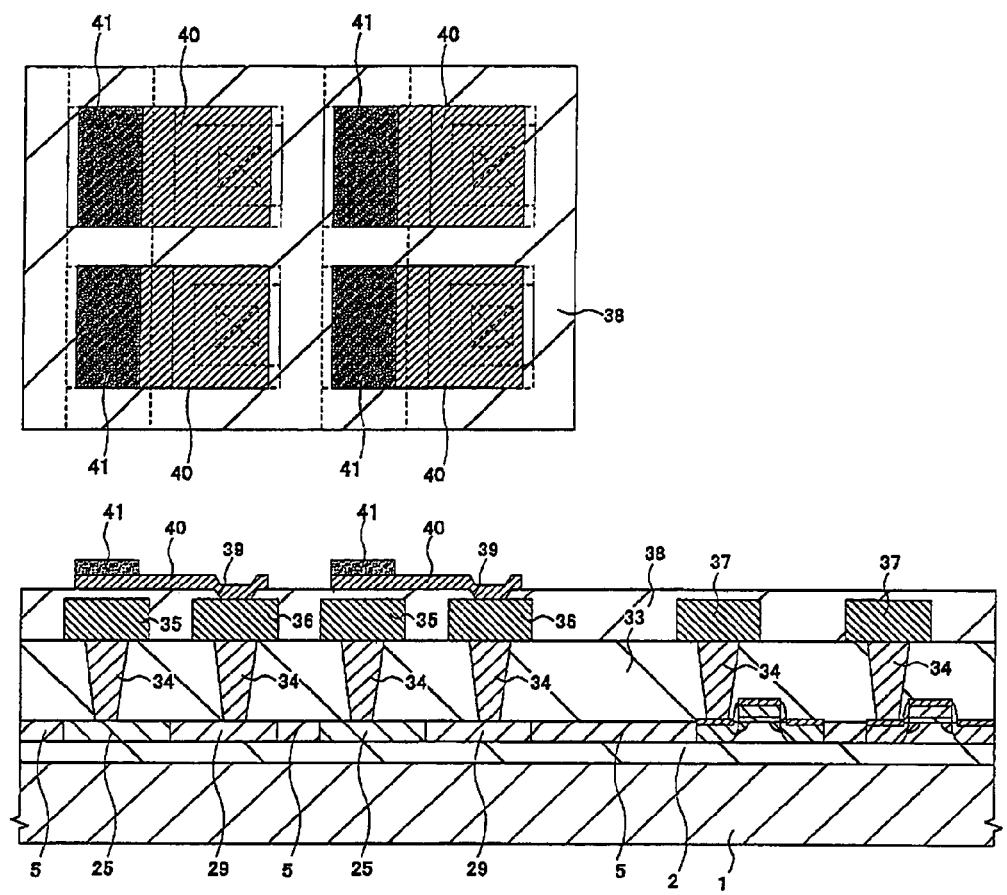
FIG. 22 shows another plan view and another cross-sectional view regarding the example of the method of fabricating the MRAM according to the first embodiment arranged in accordance with the order of the steps.

Next, the antimagnetic layer 41d, the pinned layer 41c, the insulating layer 41b and the free layer 41a, which collectively constitute the MTJ element, are deposited consecutively, and the MTJ elements 41 are formed by patterning these layers (FIG. 22). The sputtering method is applicable to deposition of the respective layers. Moreover, the dry etching method is applicable to patterning. Note that the order of laminating the respective layers for constituting the MTJ element can be inverted as mentioned previously.

Figure 23:
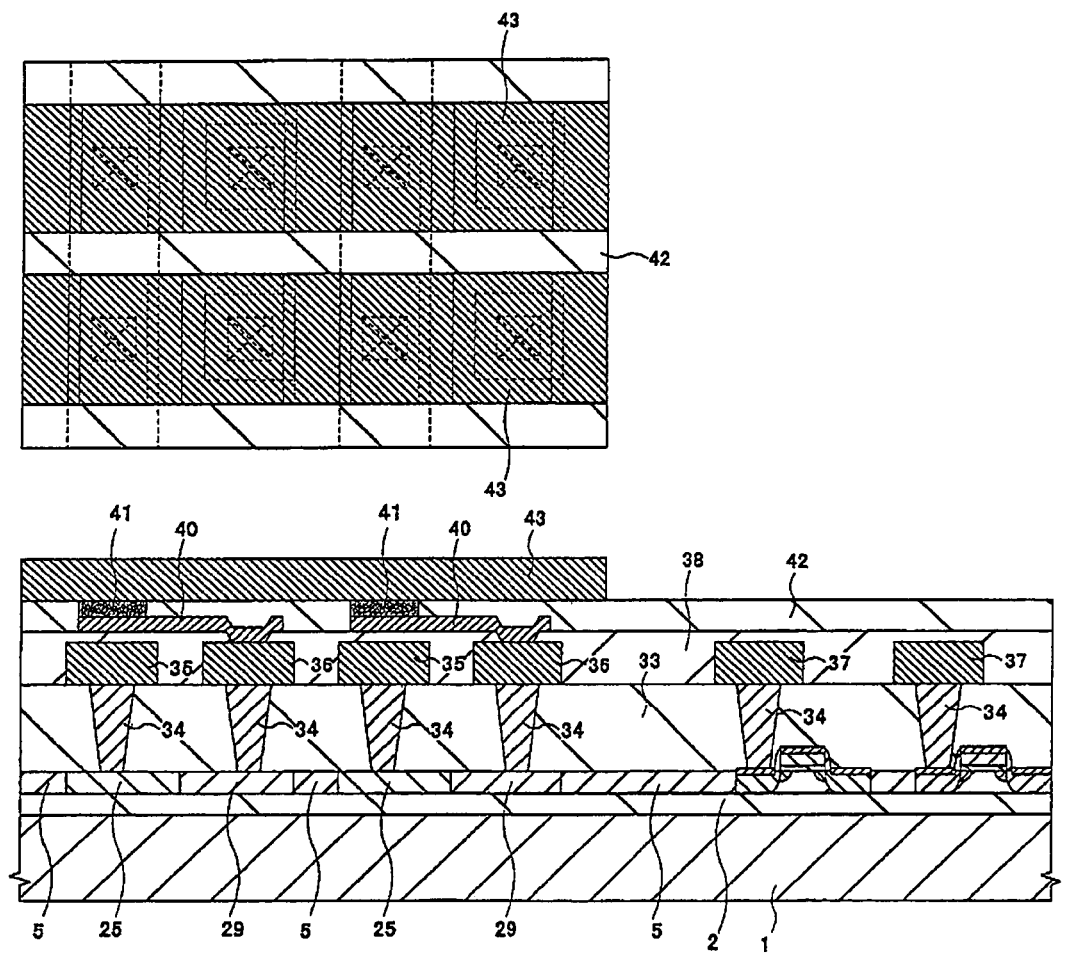
FIG. 23 shows another plan view and another cross-sectional view regarding the example of the method of fabricating the MRAM according to the first embodiment arranged in accordance with the order of the steps.

Thereafter, the insulating film 42 for covering the MTJ elements 41 and the local wiring 40 is formed, and then surfaces of the MTJ elements 41 are exposed by the CMP method, for example. Subsequently, an unillustrated metallic film is deposited thereon, and the metallic film is formed into the second layer wiring (the sense lines 43) by patterning (FIG. 23). Although the second layer wiring is not illustrated above the MOSFETs in the drawing, it is needless to say that the wiring for the MOSFETs of the peripheral circuit is also formable at discretion. Thereafter, it is possible to form an arbitrary number of wiring layers thereon. However, description thereon will be omitted.

According to the fabricating method of this embodiment, it is possible to form the junction diodes in the memory cell region easily without substantial requirements of additional steps. Moreover, flat planes can be formed by use of the CMP method or the like, and the local wiring 40 made of the metallic film is adopted as a base layer for the MTJ element 41. Accordingly, it is possible to secure flatness required for formation of the MTJ element 41. It is possible to form the MRAM memory cell expectable for stable operations based on the method of fabricating a logic circuit in the prior art, by arranging some mask modifications and the minimum required number of additional masks.

(Second Embodiment)

An MRAM according to this embodiment is an example of modifying structures of the diodes in the MRAM described in first embodiment. In the following, description regarding the same constitutions as those in first embodiment will be omitted, whereby description will be highlighted on different parts from first embodiment.

Figure 24:
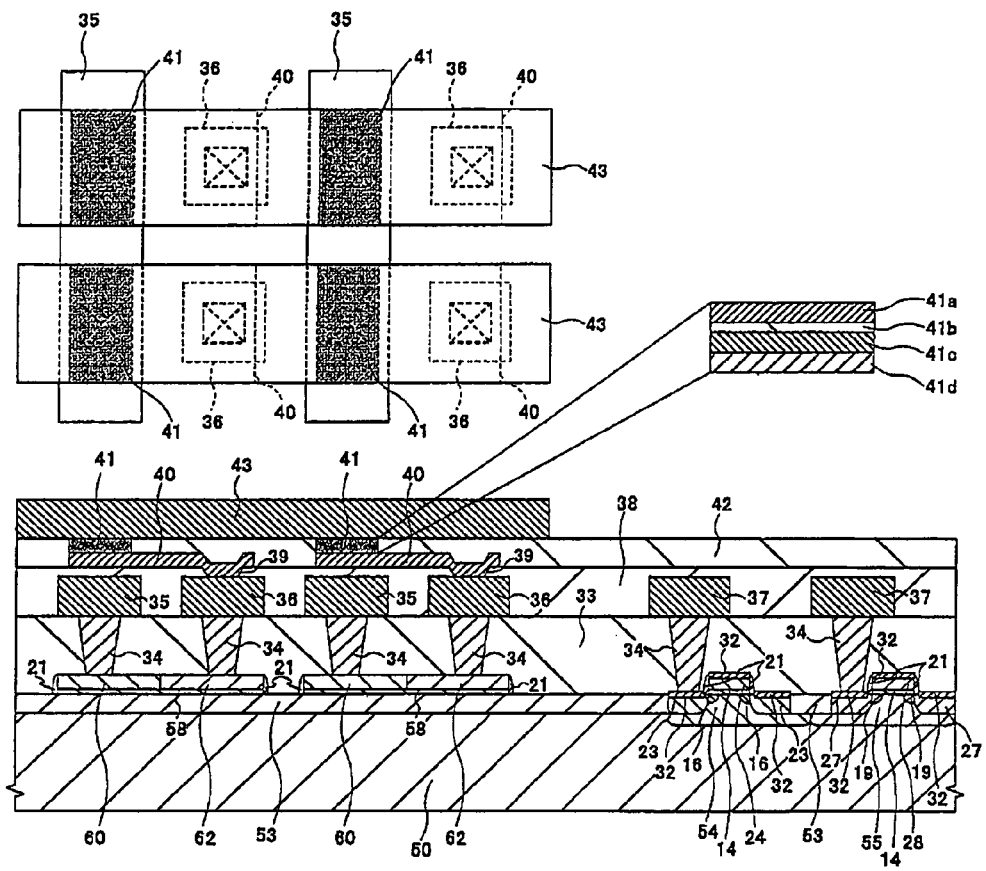
FIG. 24 shows a cross-sectional view and a plan view partially exemplifying a memory cell array and a peripheral circuit on one example of an MRAM according to a second embodiment.
Figure 25:
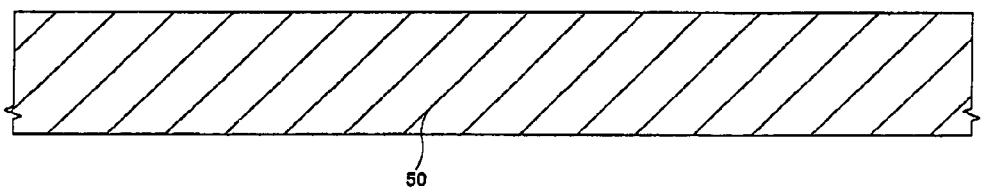
FIG. 25 is a cross-sectional view showing one example of a method of fabricating the MRAM according to the second embodiment arranged in accordance with the order of the steps.

FIG. 24 shows a cross-sectional view and a plan view partially exemplifying a memory cell array and a peripheral circuit on one example of an MRAM according to the second embodiment. The MRAM of this embodiment is formed on a silicon substrate (a silicon wafer) 50. An isolation region 53 is formed on a surface portion of the silicon substrate 50, and a p well 54 and an n well 55 to be defined by the isolation region 53 are formed in a peripheral circuit region. An n-channel-type MOSFET is formed on the p well 54 and a p-channel-type MOSFET is formed on the n well 55. Diodes are formed on the isolation region 53 in a memory cell region. The diode includes an n-type semiconductor layer 60 and a p-type semiconductor layer 62, which collectively constitute a junction diode. Moreover, the n-type semiconductor layer 60 and the p-type semiconductor layer 62 are formed on the isolation region 53 as an island. In other words, the diode in the memory cell region is isolated electrically from other elements and from the silicon substrate 50. In this way, generation of parasitic transistors can be prevented. As it will be described later, the n-type semiconductor layers 60 and the p-type semiconductor layers 62 are formed simultaneously with gate electrodes of the MOSFETs.

Figure 26:
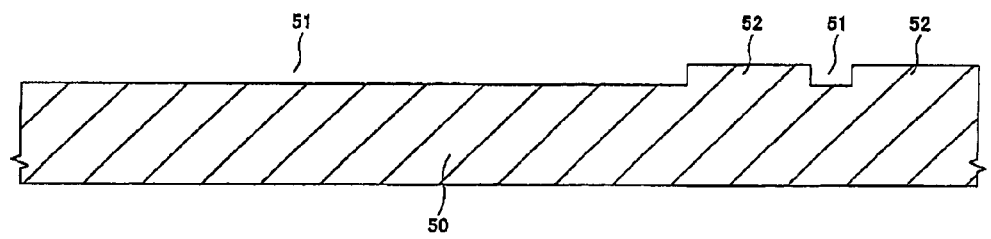
FIG. 26 is another cross-sectional view showing the example of the method of fabricating the MRAM according to the second embodiment arranged in accordance with the order of the steps.
Figure 27:
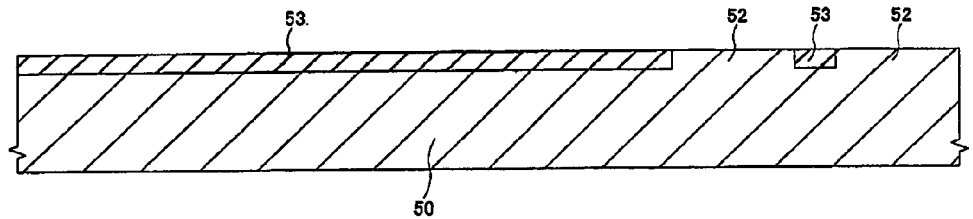
FIG. 27 is another cross-sectional view showing the example of the method of fabricating the MRAM according to the second embodiment arranged in accordance with the order of the steps.

FIG. 25 to FIG. 35 are cross-sectional views and plan views showing one example of a method of fabricating the MRAM of the second embodiment arranged in accordance with the order of the steps. First, the silicon substrate (the silicon wafer) 50 is prepared (FIG. 25), and trenches 51 are formed on a surface thereof by use of the publicly-known photolithography and etching techniques (FIG. 26). Thereafter, an unillustrated insulating film is deposited thereon and the insulating film is removed by use of the CMP method, for example, whereby the insulating film is buried into the trenches 51 to form the isolation regions 53 (FIG. 27).

Figure 28:
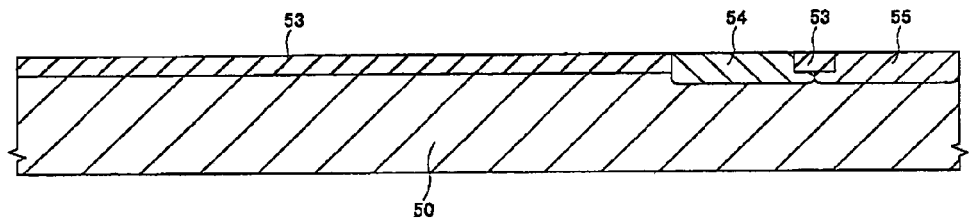
FIG. 28 is another cross-sectional view showing the example of the method of fabricating the MRAM according to the second embodiment arranged in accordance with the order of the steps.
Figure 29:
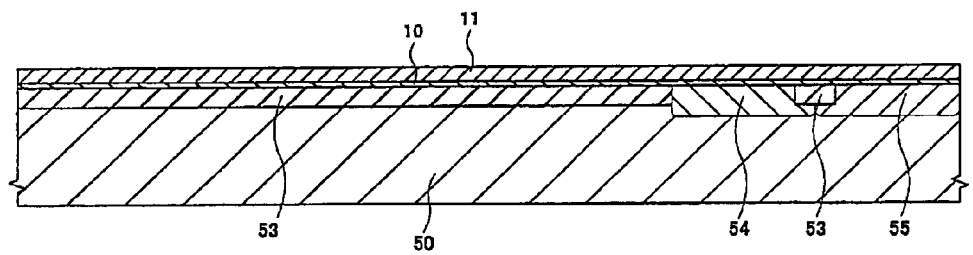
FIG. 29 is another cross-sectional view showing the example of the method of fabricating the MRAM according to the second embodiment arranged in accordance with the order of the steps.

Next, the p well 54 and the n well 55 are formed in the peripheral circuit region by use of the ion implantation method, for example (FIG. 28). Then, a silicon oxide film 10 and a polycrystalline silicon film 11 are formed on the entire surface of the substrate (FIG. 29).

Figure 30:
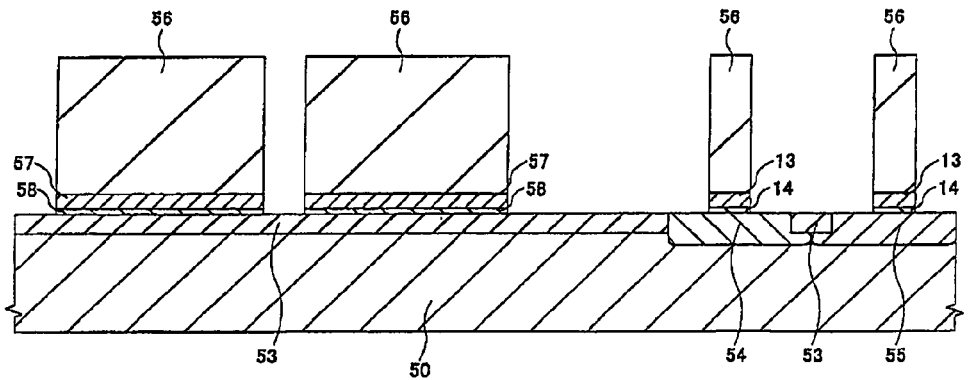
FIG. 30 is another cross-sectional view showing the example of the method of fabricating the MRAM according to the second embodiment arranged in accordance with the order of the steps.

Then, formed is a photoresist film 56, which includes patterns for forming the gate electrodes of the MOSFETs and patterns for covering regions where the n-type semiconductor layers 60 and the p-type semiconductor layers 62 will be formed. The polycrystalline silicon film 11 and the silicon oxide film 10 are etched by use of the photoresist film 56 as a mask (FIG. 30). In this step, regions for forming the gate electrodes of the MOSFETs and semiconductor layers (the islands) for forming the diodes thereon are formed simultaneously.

Figure 31:
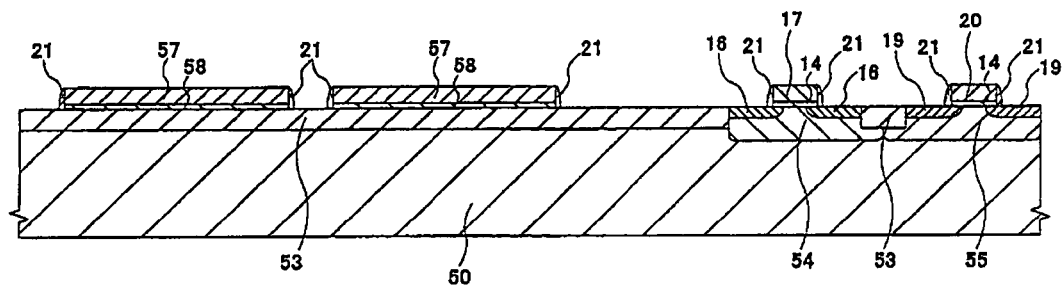
FIG. 31 is another cross-sectional view showing the example of the method of fabricating the MRAM according to the second embodiment arranged in accordance with the order of the steps.

Then, low-density impurity regions (16 and 19) of the MOSFETs are formed as similar to the first embodiment, and sidewalls 21 are further formed (FIG. 31).

Figure 32:
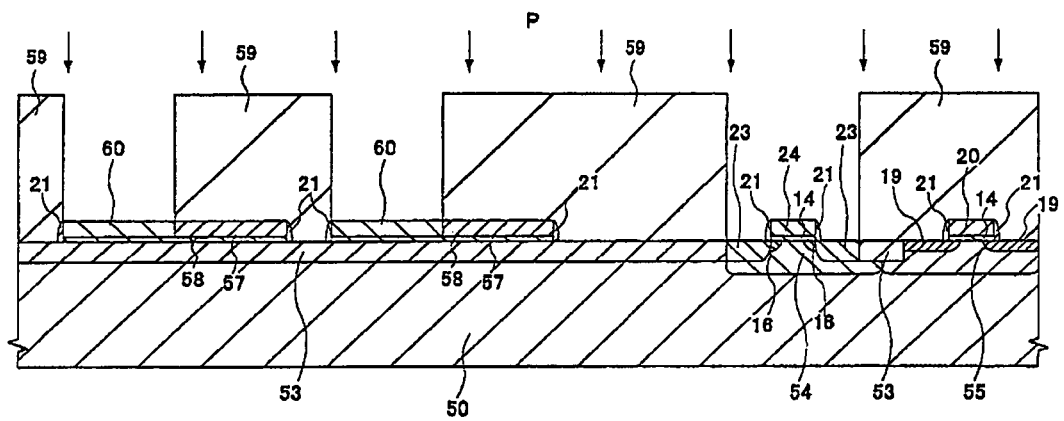
FIG. 32 is another cross-sectional view showing the example of the method of fabricating the MRAM according to the second embodiment arranged in accordance with the order of the steps.

Then, formed is a photoresist film 59 provided with apertures in the region where the n-channel-type MOSFET of the peripheral circuit is formed and the regions in the memory cell region where the n-type semiconductor layers 60 of the diodes are formed, and phosphorus (P) is ion-implanted therein as an impurity (FIG. 32). As it has been described in the first embodiment, high-density n-type semiconductor regions 23 and an n-type gate electrode 24 are formed; simultaneously, phosphorus is implanted in the relevant portions of the semiconductor layer 57 in the memory cell region, whereby the n-type semiconductor layers 60 are formed.

Figure 33:
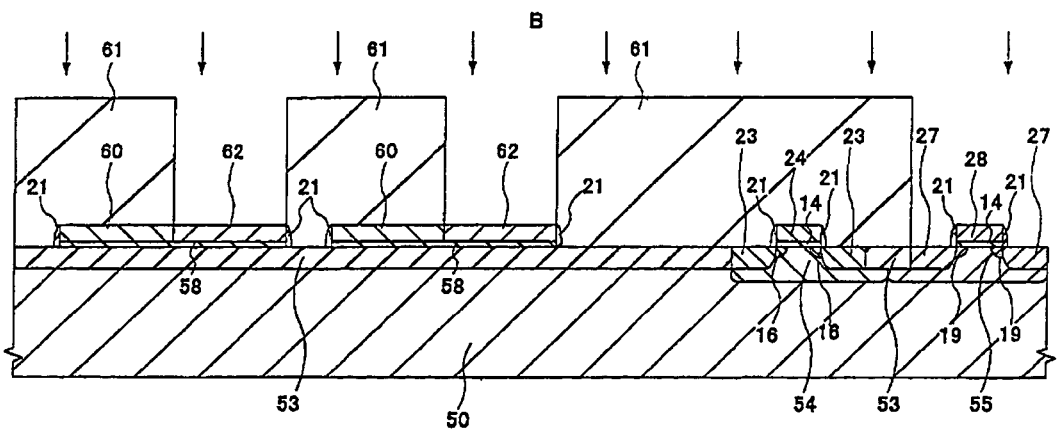
FIG. 33 is another cross-sectional view showing the example of the method of fabricating the MRAM according to the second embodiment arranged in accordance with the order of the steps.

Next, formed is a photoresist layer 61 provided with apertures in the region where the p-channel-type MOSFET of the peripheral circuit is formed and the regions in the memory cell region where the p-type semiconductor layers 62 of the diodes are formed, and boron (B) is ion-implanted therein as the impurity (FIG. 33). As similar to the foregoing step, high-density p-type semiconductor regions 27 and a p-type gate electrode 28 are formed; simultaneously, boron is implanted in the relevant portions of the semiconductor layer 57 in the memory cell region, whereby the p-type semiconductor layers 62 are formed.

In this way, the diodes including the n-type semiconductor layers 60 and the p-type semiconductor layers 62 are formed. As it has been described above, these diodes are formed as silicon islands on the isolation region 53. Accordingly, the diodes do not constitute parasitic transistors. Hence, normal operations of the MRAM memory cell can be secured. Moreover, as similar to the first embodiment, no additional steps are required for formation of the diodes. Accordingly, the diodes can be fabricated by arranging some mask modifications in the course of the conventional fabrication process.

Figure 34:
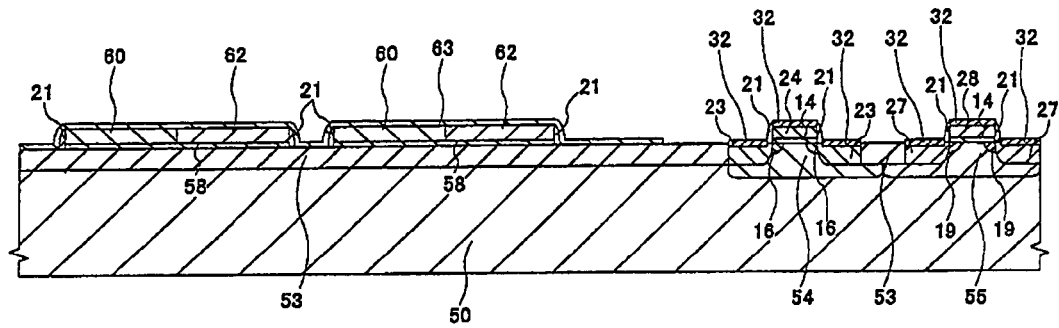
FIG. 34 is another cross-sectional view showing the example of the method of fabricating the MRAM according to the second embodiment arranged in accordance with the order of the steps.

Next, as similar to the first embodiment, a mask layer 63 for covering the memory cell region is formed and then the salicide process is conducted. In this way, a metal silicide layer 32 is formed (FIG. 34). The mask layer 63 can prevent leakage of electric currents on junction interfaces of the diodes.

Figure 35:
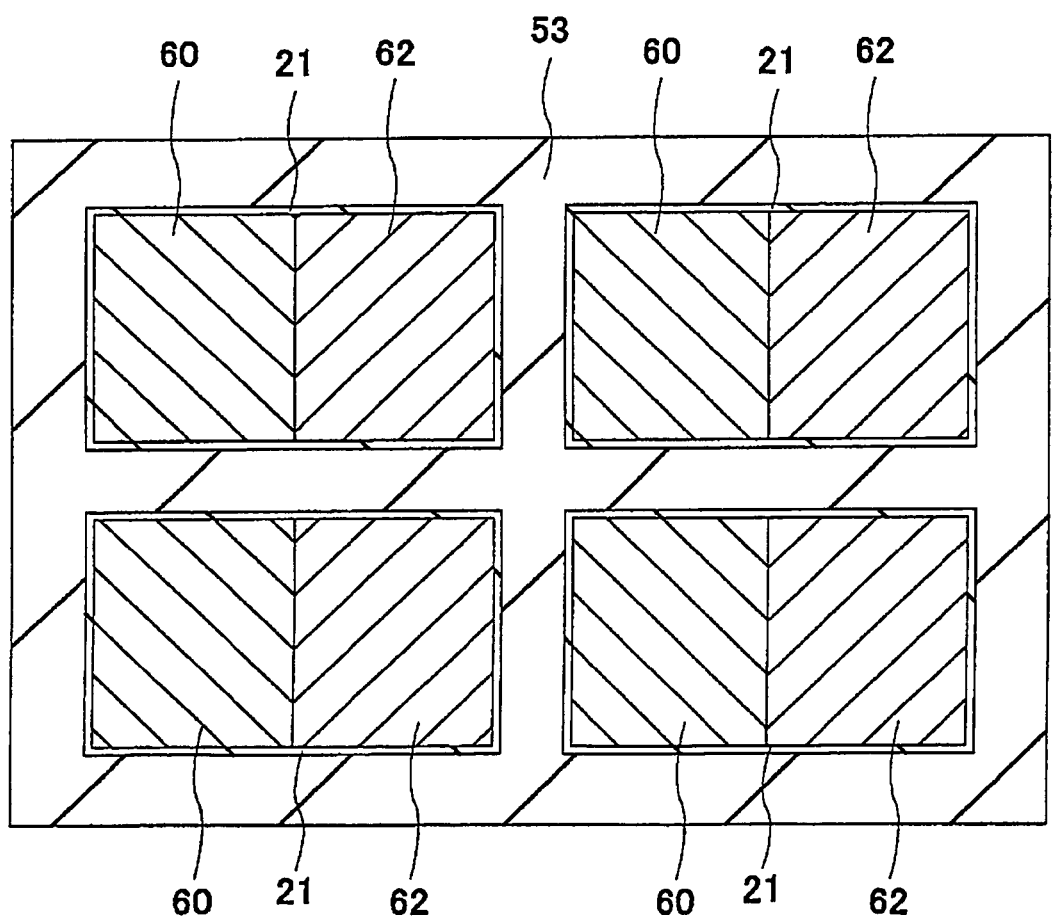
FIG. 35 is a plan view showing the example of the method of fabricating the MRAM according to the second embodiment arranged in accordance with the order of the steps.

FIG. 35 shows a plan view of the memory cell region at this stage. The pairs of the n-type semiconductor regions 60 and the p-type semiconductor regions 62 are formed as the islands on the isolation region 53 and thereby separated electrically from the respective elements and from the substrate. Therefore, no parasitic translators are generated. Moreover, each of the n-type semiconductor layer 60 and the relevant p-type semiconductor layer 62 are formed symmetrically, and a boundary of the two layers constitutes a composition surface. As similar to the first embodiment, sufficiently low on-state resistance can be secured. Since the process thereafter is similar to the process in the first embodiment, detailed description will be omitted.

According to this embodiment, since the diodes are formed as the islands on the isolation region 53, no parasitic transistors are generated. In addition, the diodes are patterned simultaneously with the gate electrodes and the impurities are doped simultaneously with formation of sources and drains of the MOSFETs. Accordingly, the diodes can be fabricated with a few additional steps.

(Third Embodiment)

An MRAM according to this embodiment is an example of further modifying structures of the diodes in the MRAM described in first embodiment. In the following, description regarding the same constitutions as those in first embodiment will be omitted, whereby description will be highlighted on different parts from first embodiment.

Figure 36:
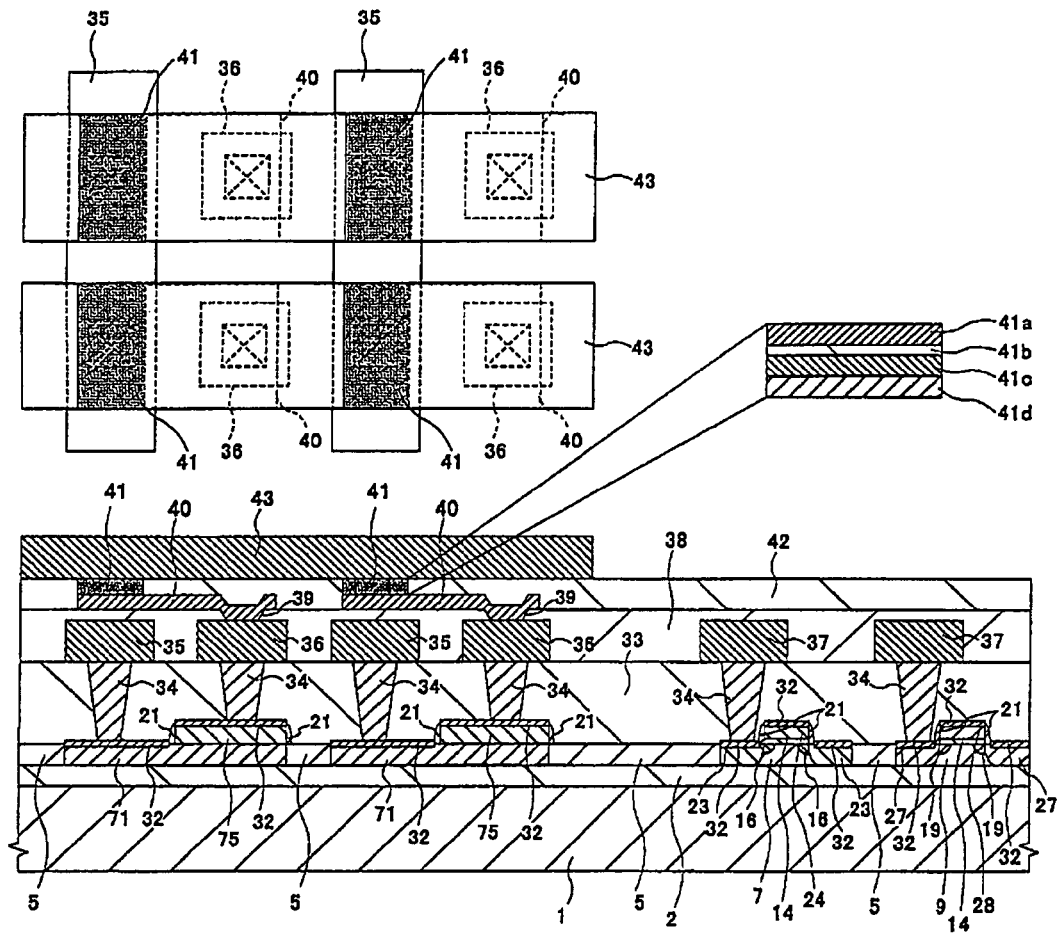
FIG. 36 shows a cross-sectional view and a plan view partially exemplifying a memory cell array and a peripheral circuit on one example of an MRAM according to a third embodiment.
Figure 37:
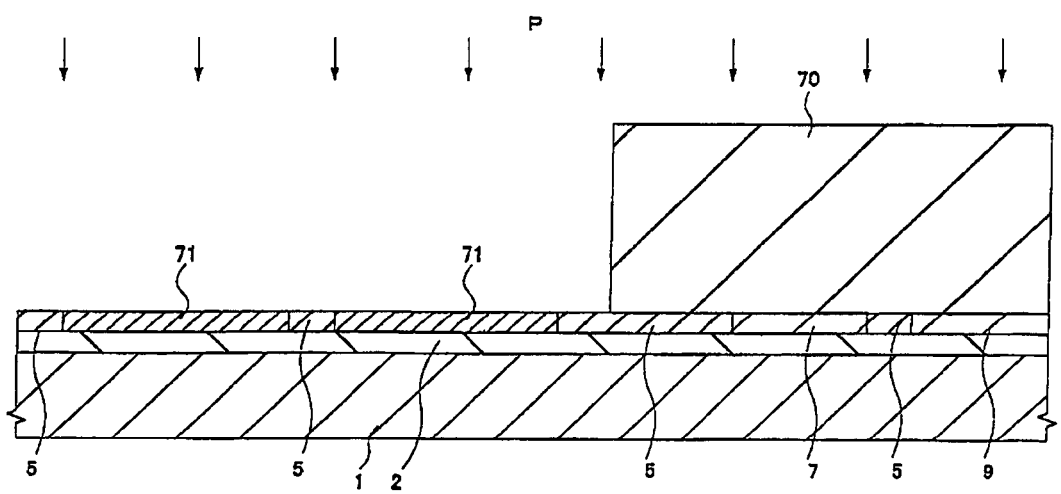
FIG. 37 is a cross-sectional view showing one example of a method of fabricating the MRAM according to the third embodiment arranged in accordance with the order of the steps.
Figure 38:
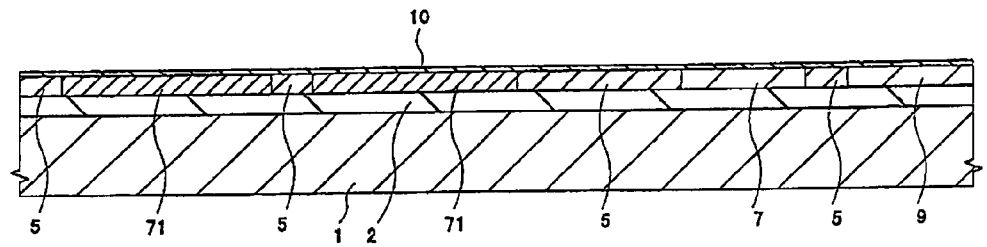
FIG. 38 is another cross-sectional view showing the example of the method of fabricating the MRAM according to the third embodiment arranged in accordance with the order of the steps.

FIG. 36 shows a cross-sectional view and a plan view partially exemplifying a memory cell array and a peripheral circuit on one example of an MRAM according to the third embodiment. The MRAM of this embodiment is formed on an SOI substrate as similar to the first embodiment. However, the diode of the third embodiment is different from the diode of the first embodiment in that the diode of the third embodiment includes an n-type semiconductor layer 71 generated from a surface semiconductor layer 3 of the SOI substrate, and a p-type semiconductor layer 75 patterned simultaneously with formation of gate electrodes of MOSFETs. In other words, the diode of the third embodiment is a diode having a composition surface, which is parallel to a surface of the substrate. Moreover, a metal silicide layer 32 is formed on a surface of the diode of the third embodiment.

FIG. 37 to FIG. 45 are cross-sectional views and plan views showing one example of a method of fabricating the MRAM of the third embodiment arranged in accordance with the order of the steps. Some initial stages of the fabricating method of the third embodiment are identical to the steps as illustrated in FIG. 3 to FIG. 7.

After active layers 7 and 9 are formed in a peripheral circuit region, a photoresist film 70 provided with an aperture on the entire surface of a memory cell region. Then, phosphorus (P) is ion-implanted as an impurity and phosphorus is thereby implanted in the surface semiconductor layer 3 to form n-type semiconductor layers 71.

Figure 39:
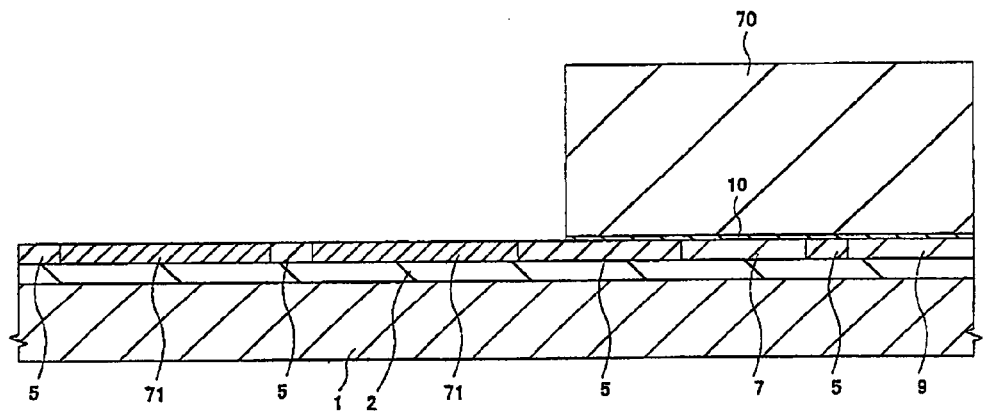
FIG. 39 is another cross-sectional view showing the example of the method of fabricating the MRAM according to the third embodiment arranged in accordance with the order of the steps.
Figure 40:
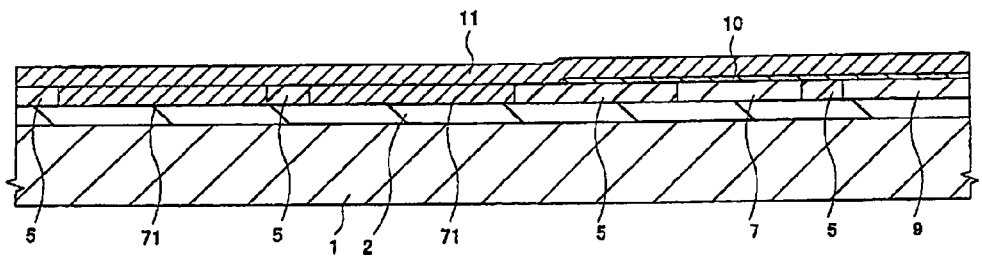
FIG. 40 is another cross-sectional view showing the example of the method of fabricating the MRAM according to the third embodiment arranged in accordance with the order of the steps.

Next, a silicon oxide film 10 is formed (FIG. 38), and then a portion of the silicon oxide film 10 in the memory cell region is removed (FIG. 39). After the photoresist film 70 is removed, a polycrystalline silicon film 11 is deposited on the entire surface of the substrate (FIG. 40).

Figure 41:
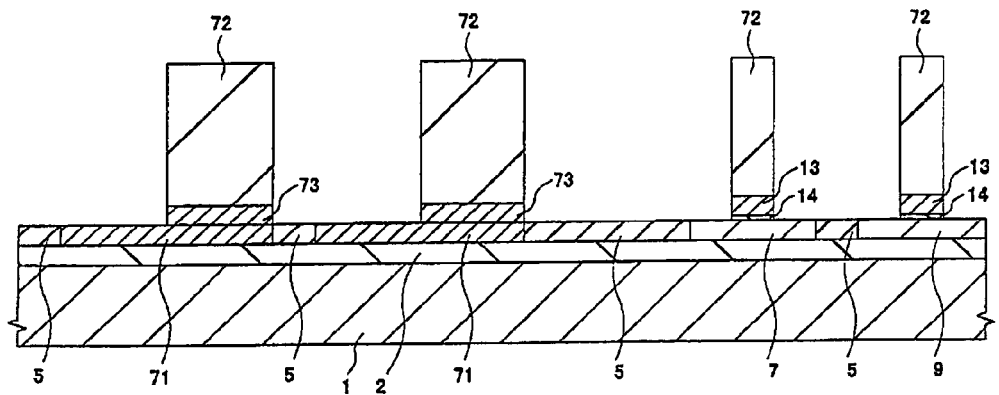
FIG. 41 is another cross-sectional view showing the example of the method of fabricating the MRAM according to the third embodiment arranged in accordance with the order of the steps.

Next, the gate electrodes are patterned as similar to the first embodiment. However, a photoresist film 72 includes patterns to prevent patterning of regions where p-type semiconductor layers 75 are supposed to be formed. By such patterning, semiconductor layers 73 are formed on the n-type semiconductor layers 71 (FIG. 41).

Figure 42:
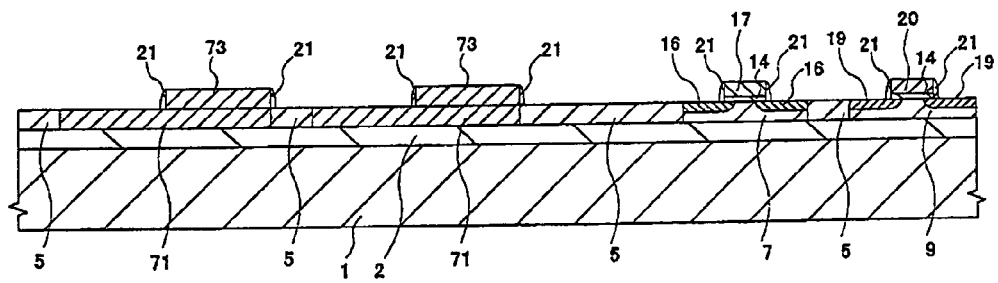
FIG. 42 is another cross-sectional view showing the example of the method of fabricating the MRAM according to the third embodiment arranged in accordance with the order of the steps.

Next, sidewalls 21 are formed on side faces of the gate electrodes as similar to the first embodiment. Since the semiconductor layers 73 are also provided in the memory cell region according to this embodiment, the sidewalls 21 are also formed on side faces thereof (FIG. 42).

Figure 43:
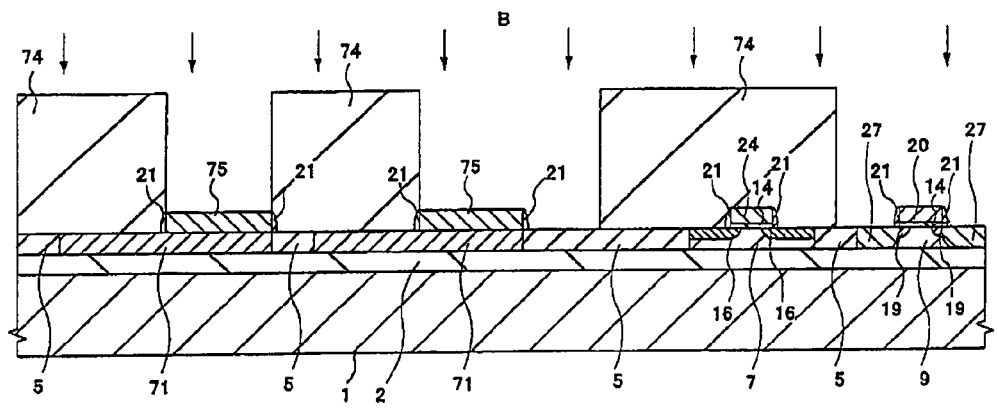
FIG. 43 is another cross-sectional view showing the example of the method of fabricating the MRAM according to the third embodiment arranged in accordance with the order of the steps.

Next, formed is a photoresist film 74 provided with apertures in a region of a p-channel-type MOSFET and the regions for forming the semiconductor layers 73, and boron (B) is ion-implanted as the impurity (FIG. 43). High-density p-type semiconductor regions 27 of the p-channel-type MOSFET are formed by this ion implantation process. Simultaneously, p-type semiconductor layers 75 are formed on the semiconductor layers 73. Here, an implanted contact layer may be also formed in each space between the p-type semiconductor layer 75 and the n-type semiconductor layer 71 in order to improve contact.

Figure 44:
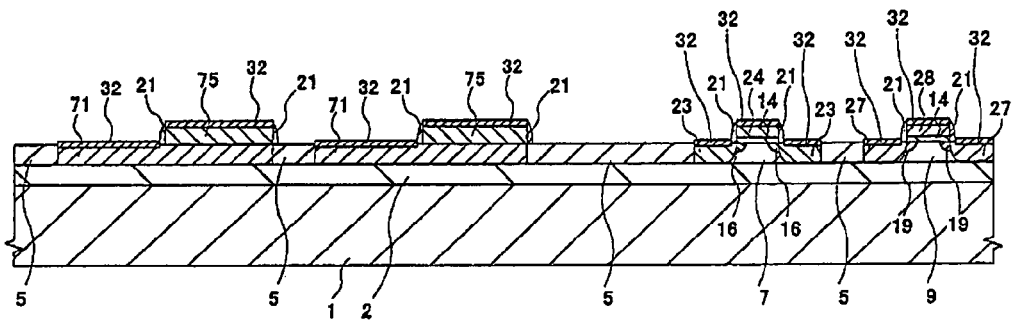
FIG. 44 is another cross-sectional view showing the example of the method of fabricating the MRAM according to the third embodiment arranged in accordance with the order of the steps.

Thereafter, high-density n-type semiconductor regions 23 of an n-channel-type MOSFET is formed as similar to the first embodiment. Further, the salicide process is carried out as similar to the first embodiment. In the third embodiment, a mask layer 30 as in the first embodiment will not be formed. Accordingly, a metal silicide layer 32 is also formed at portions where the n-type semiconductor layers 71 are exposed, and on the p-type semiconductor layers 75 (FIG. 44). Nevertheless, since the sidewalls 21 are formed on the side faces of the p-type semiconductor layers 75 of the third embodiment, no leakage occurs between the n-type semiconductor layer 71 and the p-type semiconductor layer 75. As the metal silicide layer 32 is also provided in the region for forming the diodes in the third embodiment, it is possible to reduce contact resistance accordingly.

Figure 45:
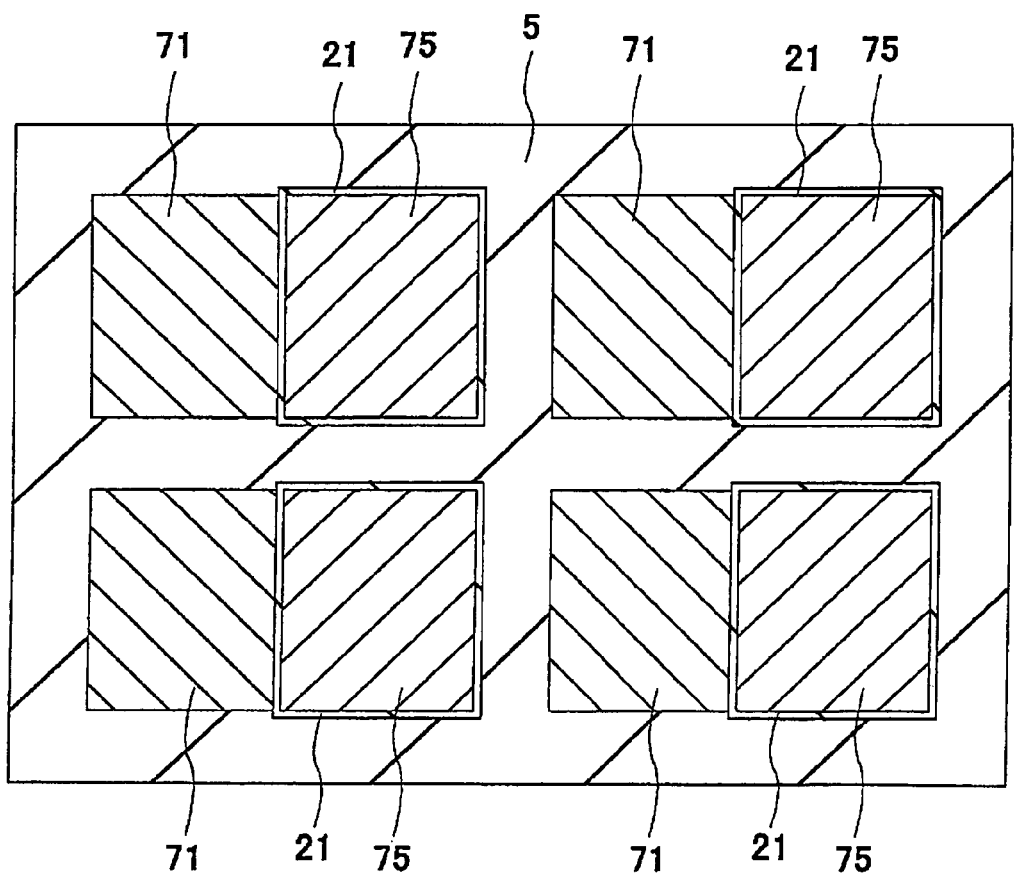
FIG. 45 is a plan view showing the example of the method of fabricating the MRAM according to the third embodiment arranged in accordance with the order of the steps.

FIG. 45 shows a plan view of the memory cell region at this stage. However, the metal silicide layer 32 is not illustrated therein. The n-type semiconductor layers 71 originally formed as the surface semiconductor layer of the SOI substrate are also formed under the p-type semiconductor layers 75. In other words, the p-type semiconductor layers 75 are formed on the n-type semiconductor layers 71. The composition surface is formed as a bottom surface of the p-type semiconductor layer 75. Accordingly, a considerably large composition surface can be obtained, whereby serial resistance (the on-state resistance) of the diode is reduced. Moreover, the n-type semiconductor layer 71 is formed on a place surrounded by the isolation region 5 of the SOI substrate and by substrate insulating layer 2. Accordingly, the n-type semiconductor layer 71 is isolated from other elements and from the substrate. As a result, the diodes of this embodiment have an effect of not generating parasitic transistors as similar to the first and the second embodiments. Since the process thereafter is similar to the process in the first embodiment, detailed description will be omitted.

According to this embodiment, since the n-type semiconductor layers 71, which are the regions for forming the diodes, are isolated electrically from other elements and from the substrate, no parasitic transistors are generated. In addition, since the n-type semiconductor layers 71 and the p-type semiconductor layers 75 are formed simultaneously with formation of the MOSFETs of a peripheral circuit, it is not necessary to increase the steps substantially. Moreover, due to the structure of the diode of the third embodiment, an area of junction can be increased, whereby the on-state resistance of the diode can be reduced. Furthermore, since the metal silicate layer 32 is formed on a surface of the diode, it is possible to reduce the contact resistance and on-state resistance of the diode. Note that the embodiment has shown the ion implantation method as an example of the method of forming the p-type semiconductor layers 75. However, it is also possible to form a polycrystalline silicon film doped with high density of a p-type impurity in advance, and to form a pn junction between the p-type semiconductor layer 75 and the n-type semiconductor layer 71 by auto-doping under a thermal treatment or the like.

The present invention achieved by the inventor has been described in particular based on certain preferred embodiments as described above. However, it is to be understood that the present invention is not limited to the embodiments specifically described in the foregoing, and various modifications, substitutions and alterations are applicable without departing from the spirit and scope of the invention.

Figure 46:
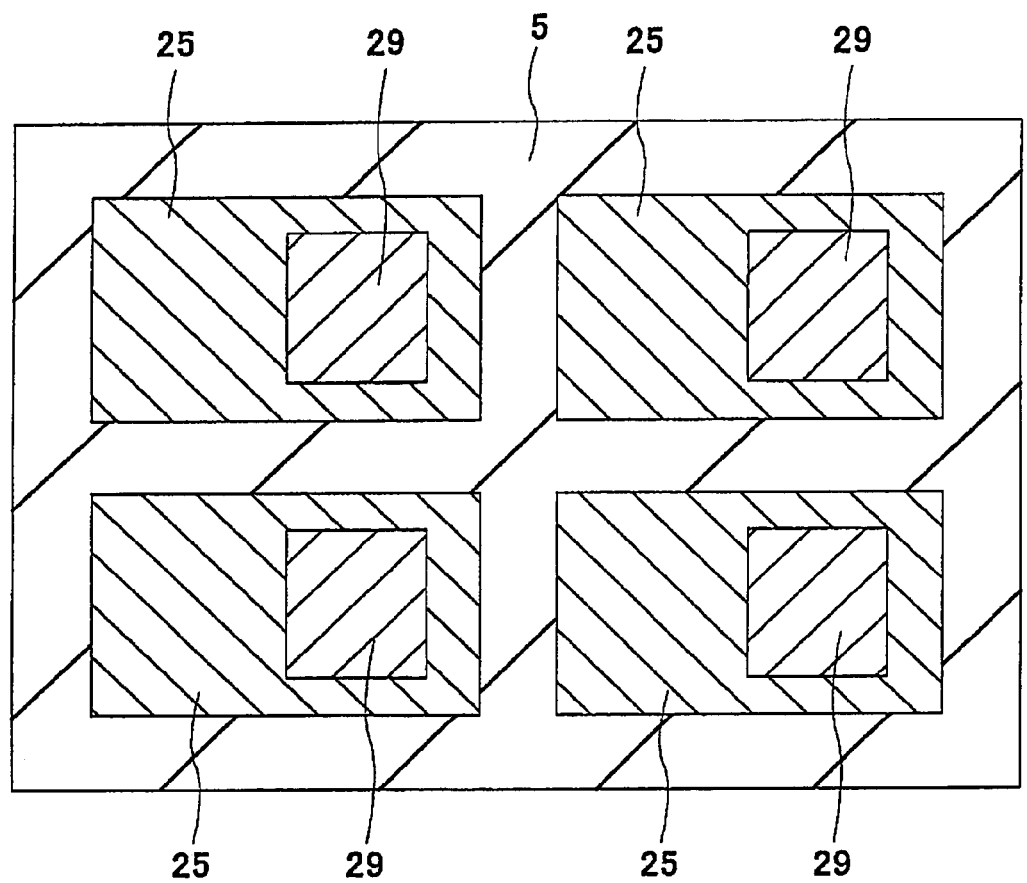
FIG. 46 is a plan view showing a memory cell array of another example of the MRAM according to any one of the first to the third embodiments.
Figure 47:
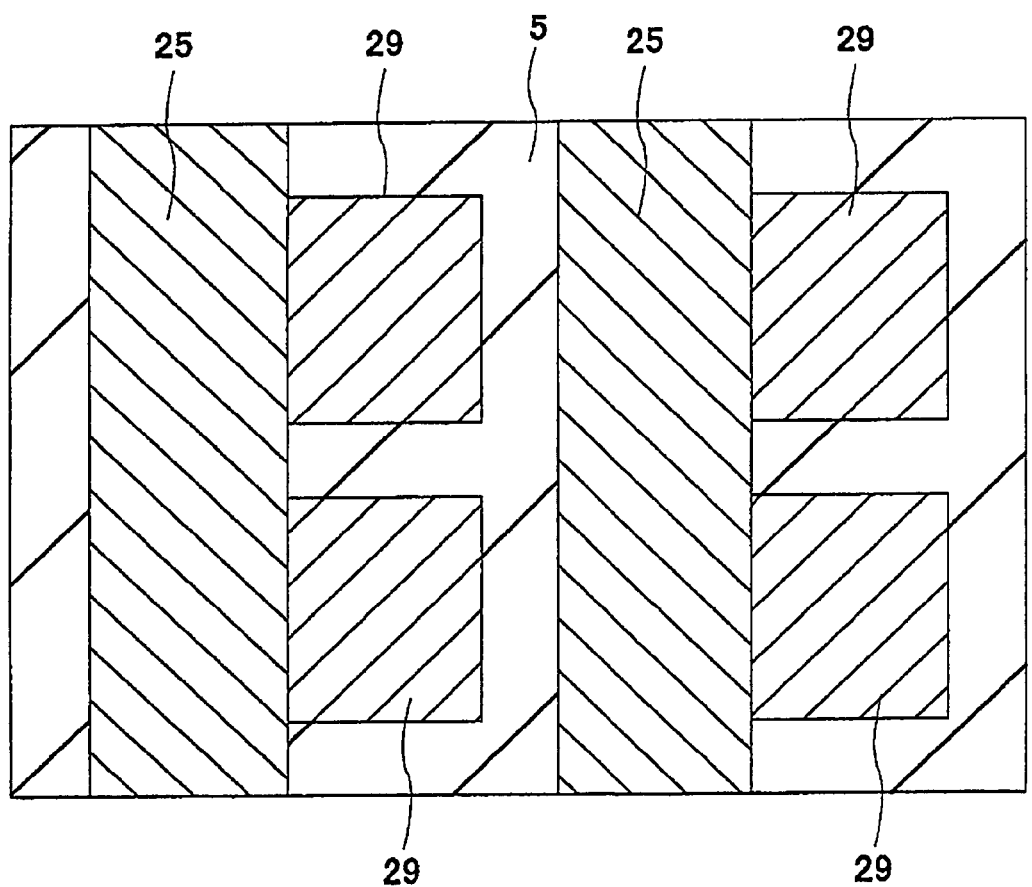
FIG. 47 is a plan view showing a memory cell array of still another example of the MRAM according to any one of the first to the third embodiments.
Figure 48:
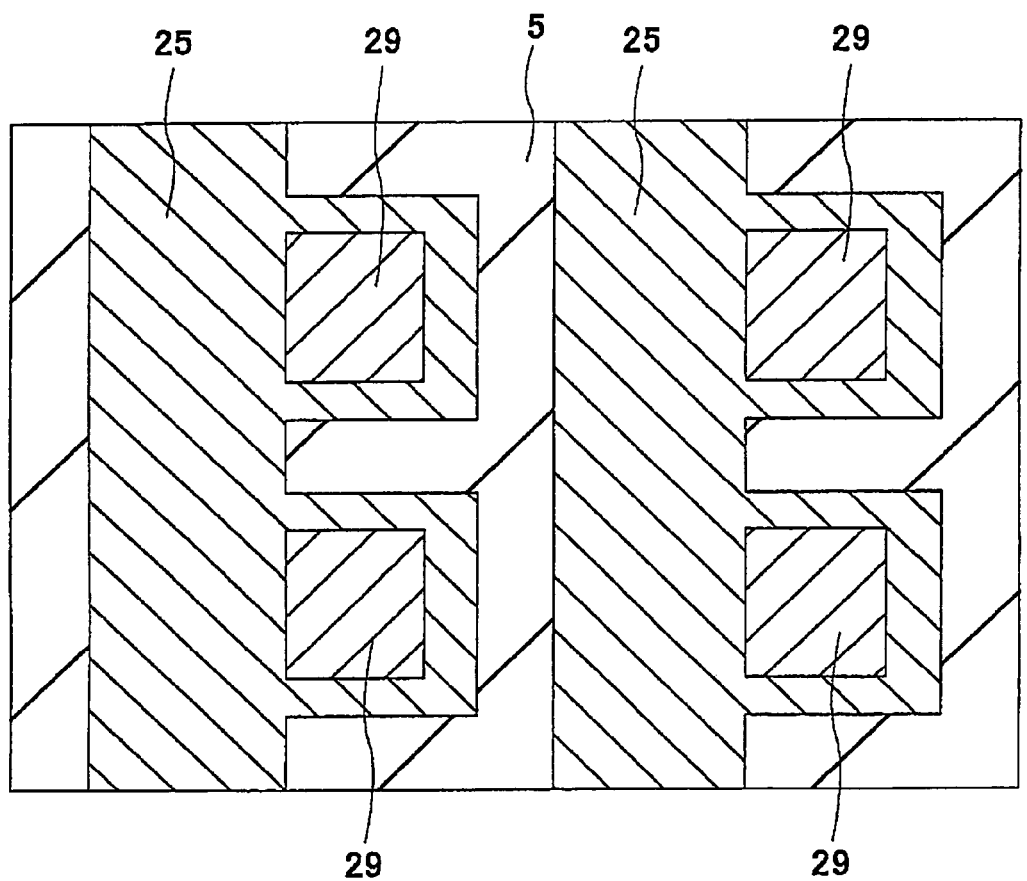
FIG. 48 is a plan view showing a memory cell array of still another example of the MRAM according to any one of the first to the third embodiments.

For example, in the first to the third embodiments, symmetrical shapes have been exemplified for plane patterns of the diodes. However, as shown in FIG. 46, it is also possible to form a pattern in which the p-type semiconductor layers 29 are surrounded by the n-type semiconductor layers 25. In this case, it is possible to reduce the on-state resistance by increasing an area of junction of the diode. Otherwise, as shown in FIG. 47, it is also possible to form the n-type semiconductor layers 25 continuously and integrally in the direction of extension of the word lines (the first direction). In this case, it is possible to set constant electric potential among the diode elements, whereby stable operations can be expected. Otherwise, as shown in FIG. 48, it is also possible to form the n-type semiconductor layers 25 integrally in the direction of extension of the word lines (the first direction) and into a pattern in which the p-type semiconductor layers 29 are surrounded by the n-type semiconductor layers 25.

It is to be also noted that the conductive types cited in the respective embodiments are examples. It is needless to say that the p types and the n types cited in the foregoing embodiments can be inverted.

Moreover, the foregoing embodiments showed the examples in which the word lines for reading also function as the word lines for writing. However, it is needless to say that the word lines for writing can be formed independently.

Furthermore, in the foregoing embodiments, storage conditions of the MTJ elements have been exemplified based on a binary system consisting of "0" and "1". However, it is also possible to provide the MTJ element with intermediate values of magnetic conditions so as to perform multilevel storage. For example, it is also possible to use four discontinuous magnetic conditions in order to achieve 2-bit information storage in one cell.

The materials of the respective members in the above-described embodiments are just examples. It is possible to use other materials as long as such materials can achieve desired performances. For example, the semiconductor material is not limited to silicon, but a compound semiconductor material is also applicable. Moreover, regarding the method of forming thin films, various other thin-film forming methods are also applicable in addition to the CVD method and the sputtering method that are cited in the embodiments. The same is true regarding the etching method.

Moreover, the first and the third embodiments show the examples of using the SOI substrate and forming the transistors of the peripheral circuit or the like on the SOI substrate. However, it is not always necessary to form the transistors of the peripheral circuit or the like on the SOI substrate. Specifically, it is also possible to provide bulk silicon (the semiconductor substrate portion 1) with offsets and to form the transistors thereon. Furthermore, trench isolation is shown as the example of the element isolation structure in the above-described embodiments. However, other isolation structures such as local oxidation of silicon (LOCOS) are also applicable.

Effects to be obtained by a typical product according to the present invention disclosed in this specification are as follows. Specifically, the present invention can provide a structure of an MRAM memory cell which prevents generation of parasitic transistors. Moreover, the present invention can provide a structure of an MRAM memory cell with a smaller occupied area than that in a FET+MTJ cell structure, whereby the MRAM memory cell is excellent in a size advantage. Furthermore, the present invention can provide a method of fabricating an MRAM memory cell excellent in compatibility with a fabrication process of a logic circuit such as a peripheral circuit.

Although the preferred embodiments of the present invention have been described in detail, it should be understood that various changes, substitutions and alternations can be made therein without departing from spirit and scope of the inventions as defined by the appended claims.

What is claimed is:

1. A semiconductor device comprising:
   a word line extending in a first direction;
   a sense line extending in a second direction being different from the first direction;
   a magnetoresistive element formed at an intersecting region of the word line and the sense line, the magnetoresistive element varying a resistance value thereof depending on a magnetic orientation; and
   a diode connected serially with the magnetoresistive element via a conductive member,
   wherein the diode is formed directly on any one of an insulator of a silicon-on-insulator substrate and of an element isolation region of a semiconductor substrate.

2. The semiconductor device according to claim 1,
   wherein the diode includes:
   a first conductive type semiconductor region in which an impurity of a first conductive type is doped in a surface semiconductor layer of the silicon-on-insulator substrate; and
   a second conductive type semiconductor region in which an impurity of a second conductive type is doped in the surface semiconductor layer.

3. The semiconductor device according to claim 2,
   wherein the first conductive type semiconductor region and the second conductive type semiconductor region are isolated from other elements by an insulating layer of the silicon-on-insulator substrate and by a trench isolation region reaching the insulating layer.

4. The semiconductor device according to claim 2,
   wherein the second conductive type semiconductor region has a plane configuration to be surrounded by the first conductive type semiconductor region, and
   the first conductive type semiconductor region is isolated from other elements by an insulating layer of the silicon-on-insulator substrate and by a trench isolation region reaching the insulating layer.

5. The semiconductor device according to claim 2,
   wherein the adjacent first conductive type semiconductor regions along the first direction are connected to each other, and
   one end of the second conductive type semiconductor region abuts on the first conductive type semiconductor region, whereby the second conductive type semiconductor region is isolated from other elements by an insulating layer of the silicon-on-insulator substrate and by a trench isolation region.

6. The semiconductor device according to claim 2,
   wherein the adjacent first conductive type semiconductor regions along the first direction are connected to each other,
   each of the first conductive type semiconductor region includes a protruded region provided for each memory cell, and
   the second conductive type semiconductor region has a plane configuration to be surrounded by the protruded region.

7. The semiconductor device according to claim 1,
wherein the diode includes:
a first conductive type semiconductor layer in which an impurity of a first conductive type is doped in a deposited semiconductor layer deposited on the element isolation region of the silicon substrate; and
a second conductive type semiconductor layer in which an impurity of a second conductive type is doped in the deposited semiconductor layer.

8. The semiconductor device according to claim 7, wherein the first conductive type semiconductor layer and the second conductive type semiconductor layer are formed on a semiconductor island region for each memory cell being formed by patterning the deposited semiconductor layer.

9. The semiconductor device according to claim 7,
wherein the second conductive type semiconductor layer has a plane configuration to be surrounded by the first conductive type semiconductor layer, and
the first conductive type semiconductor layer is a semiconductor island region for each memory cell being formed by patterning the deposited semiconductor layer.

10. The semiconductor device according to claim 7,
wherein the first conductive type semiconductor layer is a semiconductor layer formed by patterning the deposited semiconductor layer so as to extend in the first direction, and
the second conductive type semiconductor layer is a semiconductor island region for each memory cell being formed by patterning the deposited semiconductor layer such that one end of the second conductive type semiconductor layer abuts on the first conductive type semiconductor layer.

11. The semiconductor device according to claim 7,
wherein the first conductive type semiconductor layer is a semiconductor layer formed by patterning the deposited semiconductor layer so as to extend in the first direction,
the first conductive type semiconductor layer includes a protruded region provided for each memory cell, and
the second conductive type semiconductor layer has a plane configuration to be surrounded by the protruded region.

12. The semiconductor device according to claim 7, wherein the deposited semiconductor layer is a polycrystalline silicon layer which constitutes a gate electrode of a field effect transistor to be formed on the semiconductor substrate.

13. The semiconductor device according to claim 1,
wherein the diode includes:
a first conductive type semiconductor region in which an impurity of a first conductive type is doped in a surface semiconductor layer of the silicon-on-insulator substrate; and
a second conductive type semiconductor layer in which an impurity of a second conductive type is doped in a deposited semiconductor layer deposited on the surface semiconductor layer.

14. The semiconductor device according to claim 13, wherein the first conductive type semiconductor region is formed so as to extend in the first direction.

15. The semiconductor device according to claim 13, wherein the deposited semiconductor layer is a polycrystalline silicon layer which constitutes a gate electrode of a field effect transistor to be formed on the silicon-on-insulator substrate.

* * * * *